US010972591B2

(12) United States Patent
Im et al.

(10) Patent No.: US 10,972,591 B2
(45) Date of Patent: Apr. 6, 2021

(54) HOUSING, METHOD OF PRODUCING THE SAME, AND ELECTRONIC DEVICE INCLUDING THE SAME

(71) Applicant: Samsung Electronics Co., Ltd., Gyeonggi-do (KR)

(72) Inventors: Junghyun Im, Gyeonggi-do (KR); Seungchang Baek, Gyeonggi-do (KR); Sooncheol Kwon, Gyeonggi-do (KR); Sungho Cho, Gyeonggi-do (KR); Changyoun Hwang, Gyeonggi-do (KR); Minwoo Yoo, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/696,418

(22) Filed: Nov. 26, 2019

(65) Prior Publication Data
US 2020/0358890 A1 Nov. 12, 2020

(30) Foreign Application Priority Data
May 10, 2019 (KR) .......................... 10-2019-0055300

(51) Int. Cl.
H04M 1/02 (2006.01)
H05K 5/02 (2006.01)
H05K 5/03 (2006.01)
H05K 5/00 (2006.01)

(52) U.S. Cl.
CPC ........ H04M 1/0266 (2013.01); H05K 5/0004 (2013.01); H05K 5/0017 (2013.01); H05K 5/0217 (2013.01); H05K 5/03 (2013.01)

(58) Field of Classification Search
CPC .... H04M 1/0266; H04M 1/02; H05K 5/0004; H05K 5/0017; H05K 5/0217; H05K 5/03; H05K 5/00; H05K 5/02; H05K 5/0226; G06F 1/16; E05D 3/06; E05D 7/00; E05D 11/08; E05D 3/18; E05D 11/10
See application file for complete search history.

(56) References Cited

U.S. PATENT DOCUMENTS

| 9,164,547 | B1 * | 10/2015 | Kwon ................... G06F 1/1656 |
| 9,535,452 | B2 * | 1/2017 | Ahn ..................... H05K 5/0017 |
| 9,578,759 | B2 * | 2/2017 | Seo ..................... H04M 1/0202 |
| 9,848,502 | B1 * | 12/2017 | Chu .......................... E05D 7/00 |
| 9,870,031 | B2 * | 1/2018 | Hsu ........................ G06F 1/1681 |

(Continued)

FOREIGN PATENT DOCUMENTS

KR 10-2016-0031041 A 3/2016

Primary Examiner — Pablo N Tran
(74) Attorney, Agent, or Firm — Cha & Reiter, LLC

(57) ABSTRACT

Provided is an electronic device comprising a front cover; a rear cover facing in a direction opposite to that of the front cover; and a side frame enclosing a space between the front cover and the rear cover, a side frame at least partially forming an external shape of the electronic device, the side frame comprising conductive material; a support at least partially extended from the side frame to the space, the support comprising conductive material; and a polymer member coupled to at least a portion of the support or the side frame, wherein the polymer member comprises a first area in which an adhesive member for attachment of the front cover or the rear cover is disposed and a second area extended from the first area and contacting the side frame.

20 Claims, 21 Drawing Sheets

(56) References Cited

U.S. PATENT DOCUMENTS

| | | | |
|---|---|---|---|
| 9,980,373 B2* | 5/2018 | Jeong | G05B 11/01 |
| 10,019,029 B1* | 7/2018 | Yu | B29C 45/1671 |
| 10,231,347 B2* | 3/2019 | Seo | H05K 5/0017 |
| 10,665,924 B2* | 5/2020 | Son | H01Q 9/04 |
| 10,750,629 B2* | 8/2020 | Kim | B32B 27/08 |
| 2009/0271753 A1 | 10/2009 | Quandt et al. | |
| 2013/0219663 A1* | 8/2013 | Cai | G06F 1/1681 |
| | | | 16/371 |
| 2014/0111954 A1* | 4/2014 | Lee | G06F 1/1641 |
| | | | 361/749 |
| 2015/0176317 A1* | 6/2015 | Lee | E05D 3/06 |
| | | | 16/251 |
| 2015/0366089 A1* | 12/2015 | Park | G06F 1/1652 |
| | | | 361/679.01 |
| 2016/0132076 A1* | 5/2016 | Bitz | H04M 1/022 |
| | | | 361/679.27 |
| 2017/0235343 A1* | 8/2017 | Cho | G06F 1/1681 |
| | | | 361/679.27 |
| 2019/0246507 A1* | 8/2019 | Hisano | H04B 1/3888 |
| 2020/0076056 A1* | 3/2020 | Froese | H01Q 1/12 |
| 2020/0081488 A1* | 3/2020 | Baker | H05K 1/11 |
| 2020/0163239 A1* | 5/2020 | Yun | H04M 1/0268 |
| 2020/0170128 A1* | 5/2020 | Kim | H05K 5/0017 |
| 2020/0175897 A1* | 6/2020 | Choi | G06F 1/1652 |
| 2020/0178410 A1* | 6/2020 | Jeon | H05K 5/0017 |

\* cited by examiner

US 10,972,591 B2

HOUSING, METHOD OF PRODUCING THE SAME, AND ELECTRONIC DEVICE INCLUDING THE SAME

CROSS-REFERENCE TO RELATED APPLICATION(S)

This application is based on and claims priority under U.S.C. 119(a) of a Korean patent application number 10-2019-0055300, filed on May 10, 2019, in the Korean Intellectual Property Office, the disclosure of which is incorporated by reference herein in its entirety.

BACKGROUND

Field of the Invention

Certain embodiments of the disclosure relate to a housing, a method of producing the same, and an electronic device including the same.

Description of the Related Art

With the development of electronic devices, for example, mobile electronic devices, the electronic devices have become a part of our daily lives. As the number of functions on devices become saturated, it becomes important to have an electronic device that is thin, rigid, and visually appealing.

SUMMARY

In accordance with an aspect of the disclosure, an electronic device, comprises a cover comprising a flat portion and a curved portion extending from at least one edge of the flat portion; a side frame connected to the cover, the side frame forming at least partially an external shape of the electronic device and comprising: a first side surface, a second side surface extended substantially perpendicularly from the first side surface, a third side surface substantially parallel to the first side surface and substantially perpendicular to the second side surface, and a fourth side surface extended substantially perpendicular from the third side surface and the first side surface and substantially parallel to the second side surface; and an adhesive disposed between the cover and the side frame; a support extending at least partially from the side frame to an internal space of the electronic device, wherein the support comprises conductive material; and a polymer member coupled to at least a portion of the support or the side frame and at least partially facing the cover member, wherein the polymer member comprises a flat surface corresponding to the flat portion of the cover and a curved surface extending from the flat surface and corresponding to the curved portion of the cover, and comprises a first area in which the adhesive is disposed and a second area extended from the first area and contacting the side frame.

In accordance with another aspect of the disclosure, an electronic device, comprising a front cover; a rear cover facing in a direction opposite to that of the front cover; and a side frame enclosing a space between the front cover and the rear cover, a side frame at least partially forming an external shape of the electronic device, the side frame comprising conductive material; a support at least partially extended from the side frame to the space, the support comprising conductive material; and a polymer member coupled to at least a portion of the support or the side frame, wherein the polymer member comprises a first area in which an adhesive member for attachment of the front cover or the rear cover is disposed and a second area extended from the first area and contacting the side frame.

BRIEF DESCRIPTION OF THE DRAWINGS

In connection with the description of the drawings, the same or similar reference numerals may be used for the same or similar components.

DETAILED DESCRIPTION

Electronic devices are released in various sizes according to functions and user preferences thereof. Although electronic devices of one manufacturer have substantially the same functions as those of other manufacturers, devices having a more enhanced design and durability may be more preferred by users.

Generally, thinner electronic device are more desirable. However, thinner electronic devices become less rigid. Accordingly, it becomes challenging to make thinner devices substantially rigid and durable.

With gradual slimming, electronic devices may include a housing (e.g., side member or side bezel structure) in which heterogeneous materials are formed by an insert injection to improve rigidity. For example, the housing may be formed with a high temperature resin (e.g., polymer) on a bracket formed with a conductive member (e.g., metal member) through injection molding. In general, the electronic device may include at least one cover member (e.g., front cover or rear cover) attached to a housing made of heterogeneous materials for waterproofing and/or bonding through an adhesive member. The cover member adhere to a conductive portion of the side member through an adhesive.

The cover member may include a flat surface and a curved portion extended from a flat surface towards the sides. A conductive portion of the side member may also include a corresponding flat surface and a curved surface extending from the flat surface. Therefore, a conductive portion of the side member attached through the cover member and the adhesive member needs to be processed a several times to adhere to each other. This lengthens the production time of the housing, increases costs, and makes the produce heavier.

Certain embodiments of the disclosure may provide a housing, a method of producing the same, and an electronic device including the same.

Certain embodiments of the disclosure may provide a housing, a method of producing the same, and an electronic device including the same that can improve assembly by shortening a production time and reducing a production cost.

Certain embodiments of the disclosure may provide a housing, a method of producing the same, and an electronic device including the same that can facilitate attachment of a 3D-shaped cover.

Hereinafter, embodiments of the present disclosure are described in detail with reference to accompanying drawings.

Figure 1:
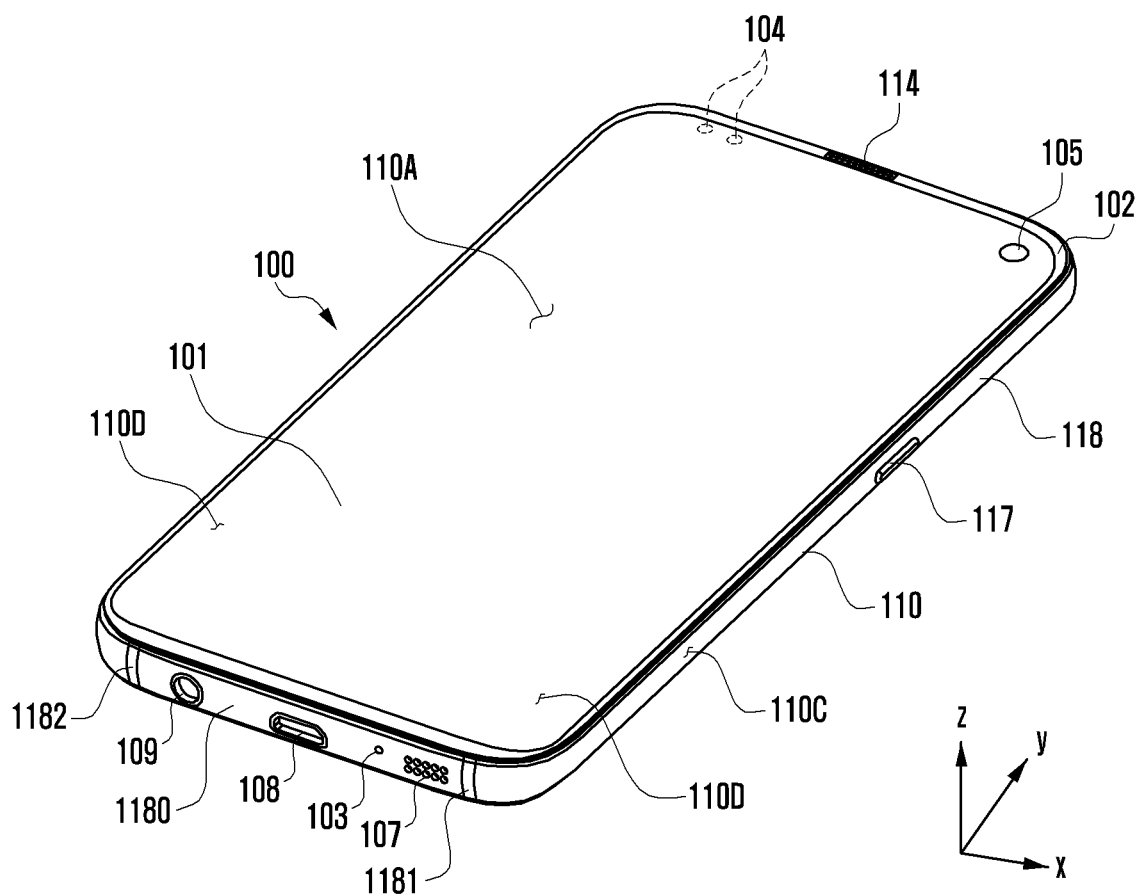
FIG. 1 is a front perspective view illustrating a mobile electronic device according to certain embodiments of the disclosure.
Figure 2:
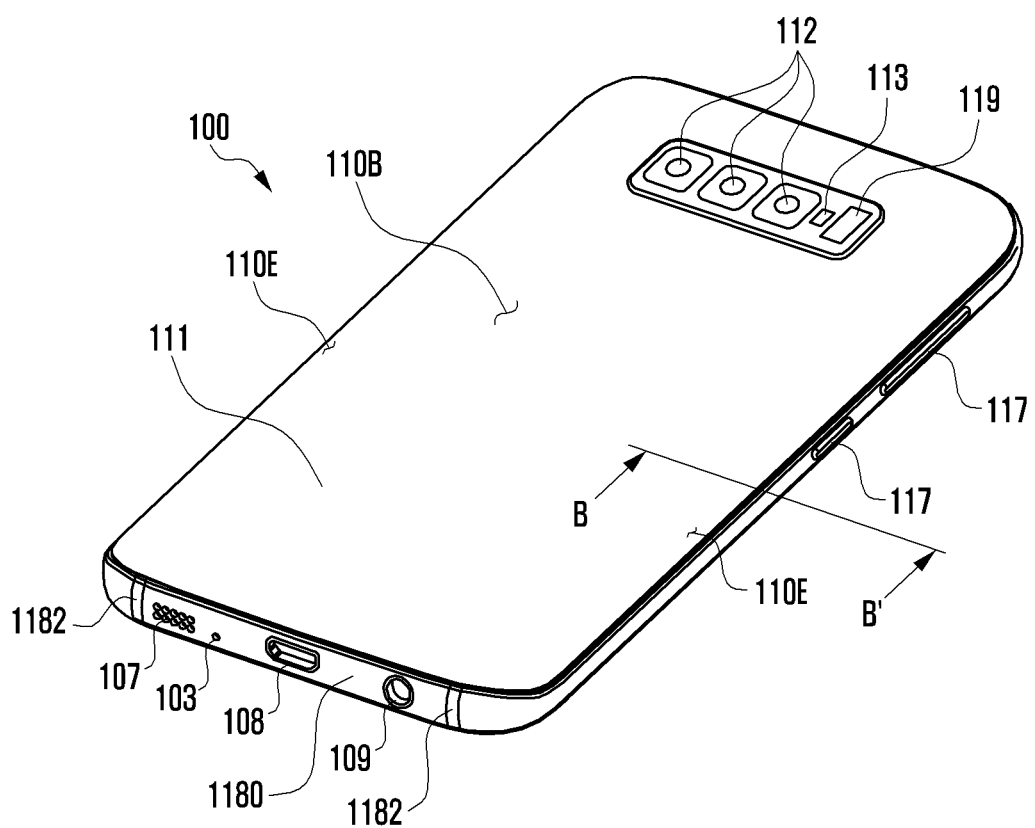
FIG. 2 is a rear perspective view illustrating the electronic device of FIG. 1.

FIGS. 1 and 2 will describe one example of an electronic device wherein the certain embodiments of this disclosure can be practiced.

FIG. 1 is a perspective view showing a front surface of a mobile electronic device 100 according to an embodiment, and FIG. 2 is a perspective view showing a rear surface of the mobile electronic device 100 shown in FIG. 1.

Referring to FIGS. 1 and 2, the mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C.

The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two side regions 110D disposed along the longer edges thereof (it is noted that where the electronic device 100 may have a rectangular shape with two shorter sides and two longer sides), respectively, and bent and extended seamlessly from the first surface 110A toward the rear plate 111. Similarly, the rear plate 111 may include two side regions 110E along the longer edges thereof, respectively, and bent and extended seamlessly from the second surface 110B toward the front plate 102. The front plate 102 (or the rear plate 111) may include only one of the side regions 110D (or one of the side regions 110E). The side regions 110D or the side regions 110E may be omitted in part. When viewed from a lateral side of the mobile electronic device 100, the lateral bezel structure 118 may be thicker/wider along shorter edges, than along the longer edges.

The mobile electronic device 100 may include at least one of a display 101, audio modules 103, 107 and 114, sensor modules 104, 116 and 119, camera modules 105, 112 and 113, a key input device 117, a light emitting device 106, and connector holes 108 and 109. The mobile electronic device 100 may omit at least one (e.g., the key input device 117 or the light emitting device 106) of the above components, or may further include other components.

The display 101 may be exposed through a substantial portion of the front plate 102, for example. At least a part of the display 101 may be exposed through the front plate 102 that forms the first surface 110A and the side region 110D of the lateral surface 110C. Outlines (i.e., edges and corners) of the display 101 may have substantially the same form as those of the front plate 102. The spacing between the outline of the display 101 and the outline of the front plate 102 may be substantially unchanged in order to enlarge the exposed area of the display 101.

A recess or opening may be formed in a portion of a display area of the display 101 to accommodate at least one of the audio module 114, the sensor module 104, the camera module 105, and the light emitting device 106. At least one of the audio module 114, the sensor module 104, the camera module 105, the fingerprint sensor 116, and the light emitting element 106 may be disposed on the back of the display area of the display 101. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104, 116 and 119 may generate electrical signals or data corresponding to an internal operating state of the mobile electronic device 100 or to an external environmental condition. The sensor modules 104, 116 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module 116 (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module 116 disposed on the second surface 110B of the housing 110.

The light emitting device 106 may be disposed on the first surface 110A of the housing 110. For example, the light emitting device 106 may provide status information of the electronic device 100 in an optical form. The light emitting device 106 may provide a light source associated with the operation of the camera module 105. The light emitting device 106 may include, for example, a light emitting diode (LED), an IR LED, or a xenon lamp.

The connector holes 108 and 109 may include a first connector hole 108 adapted for a connector (e.g., a universal serial bus (USB) connector) for transmitting and receiving power and/or data to and from an external electronic device, and/or a second connector hole 109 adapted for a connector (e.g., an earphone jack) for transmitting and receiving an audio signal to and from an external electronic device.

With the slimming of the electronic device 100—the reduced gap between the front plate 102 and the rear plate 111—materials may be inserted by injection molding to increase the rigidity of the electronic device 100. As will be described below, the certain aspects of the present disclosure may reduce the number of times that the rear plate 111 may have to be processed to adhere to a conductive member.

Figure 3:
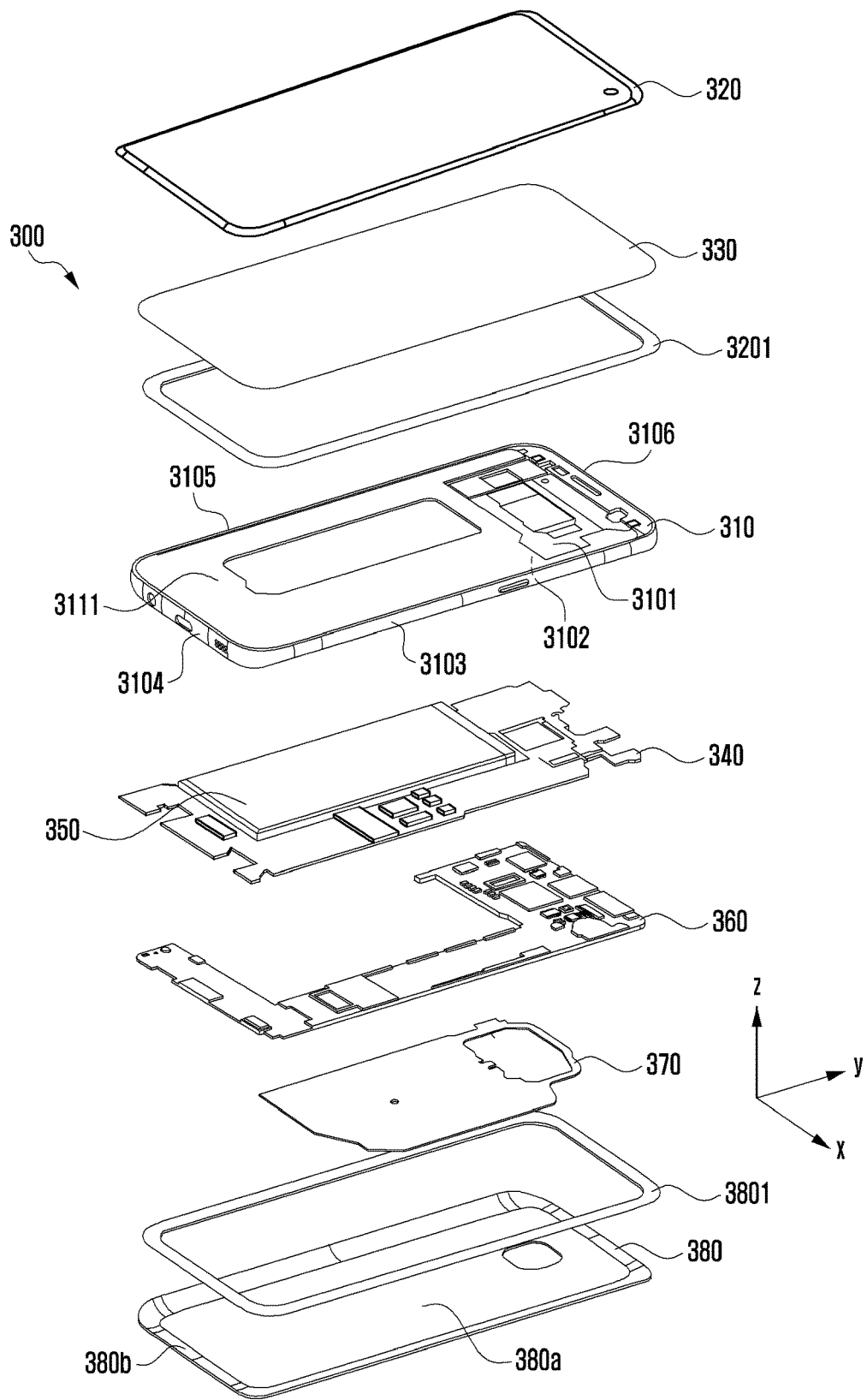
FIG. 3 is an exploded perspective view illustrating the electronic device of FIG. 1.

FIG. 3 is an exploded perspective view showing a mobile electronic device 300 shown in FIG. 1.

Referring to FIG. 3, the mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

In certain embodiments, the electronic device 300 can include a cover (such as a rear plate 380) includes a flat portion 380a and a curved portion 380b. A side member The first support 3111 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the PCB 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

In certain embodiments, the electronic device 300 can include a side frame, such as lateral bezel structure 310, and a support, such as first support 3111 extending at least partially from the side frame to an internal space of the electronic device 300, and a polymer coupled to the support 3111. The support and/or side frame can comprise conductive material, such as metal.

The memory may include, for example, volatile memory or non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

According to certain embodiments, the side frame 310 may include a first support 3111 extended at least partially to an internal space of the electronic device 300. According to one embodiment, the first support 3111 may include a first surface 3101 facing a front plate 320 and a second surface 3102 facing in a direction opposite to that of the first surface 3101. According to one embodiment, the side frame 310 may include a first side surface 3103 having a first length, a second side surface 3104 extended substantially perpendicularly from the first side surface 3103 and having a second length smaller than the first length, a third side surface 3105 having the first length and extended substantially parallel to the first side surface 3103 from the second side surface 3104, and a fourth side surface 3106 extended substantially parallel to the second side surface 3104 from the third side surface 3105 and having a second length. "Substantially perpendicular" or "substantially perpendicularly" shall include perpendicular and any amount of deviation from perpendicular which appears to the human eye as perpendicular, or within 3 degrees of perpendicular. "Substantially parallel" shall include parallel and any amount of deviation from parallel which appears to the human eye as parallel, or within 3 degrees of parallel.

According to certain embodiments, the side frame 310 may be formed in a form in which heterogeneous materials are combined. For example, the side frame 310 may be formed with a polymer member formed through an injection process using a mold in a conductive member (e.g., metal member). According to one embodiment, the electronic device 300 may include an adhesive 3801 disposed between a rear plate 380 (or cover) and the side frame 310. According to one embodiment, the side frame 310 may be formed with a polymer member formed through an injection process using a mold in an attachment surface to which the adhesive 3801 is attached. According to one embodiment, the electronic device 300 may include another adhesive 3201 disposed between the front plate 320 and the side frame 310 or between a display 330 and the side frame 310. According to one embodiment, the above-described adhesives 3801 and 3201 may bond attached members and waterproof the electronic device 300.

"Side frame", e.g., side frame 310 shall be understood to include the generally rectangular ring formed by the four surfaces that form the side surfaces of the electronic device. The support, e.g., support 311 shall be understood to be that portion that extends inward from the side frame.

Figure 4:
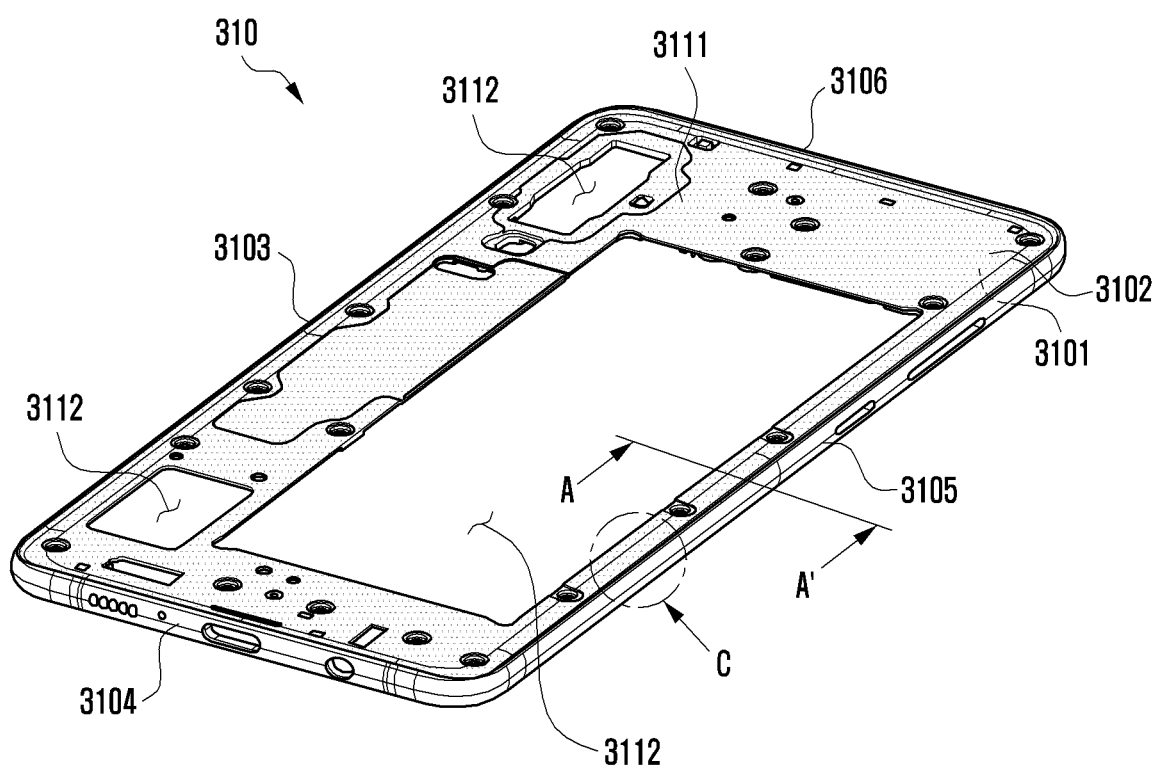
FIG. 4 is a rear perspective view illustrating a side member according to certain embodiments of the disclosure.
Figure 5A:
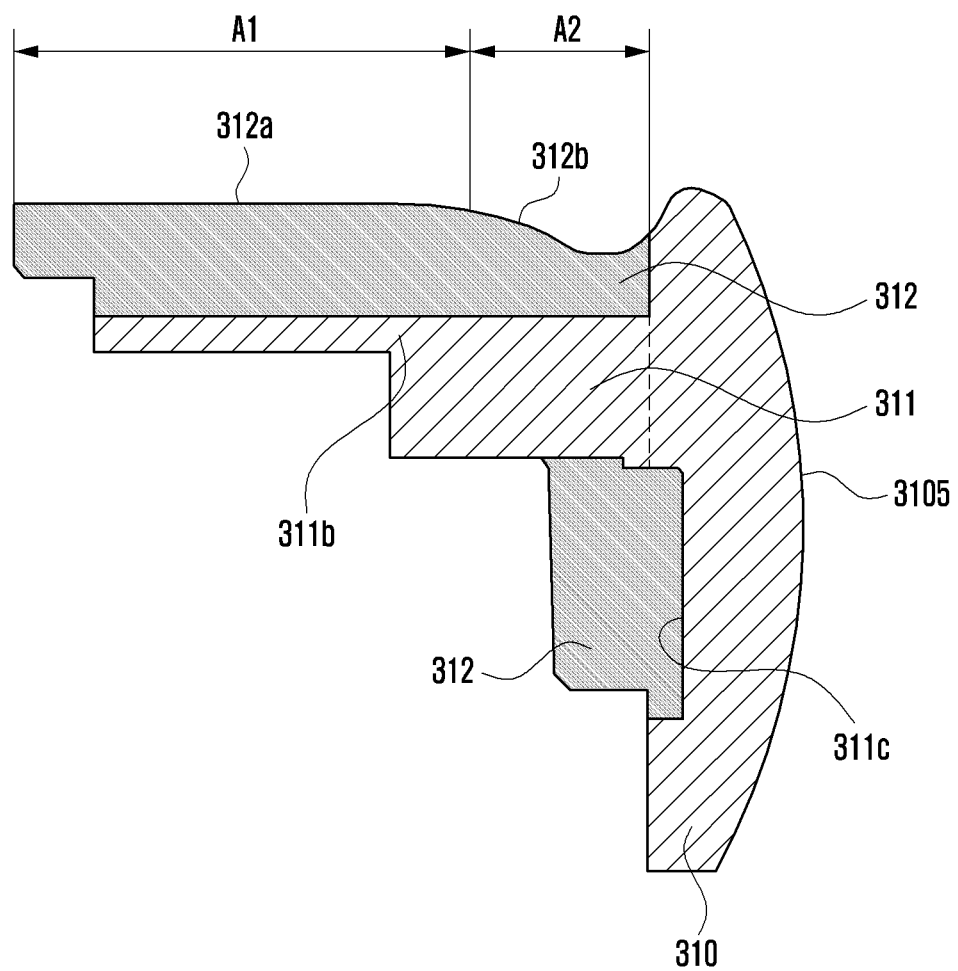
FIG. 5A is a partial cross-sectional view illustrating the side member taken along line A-A' of FIG. 4.
Figure 5B:
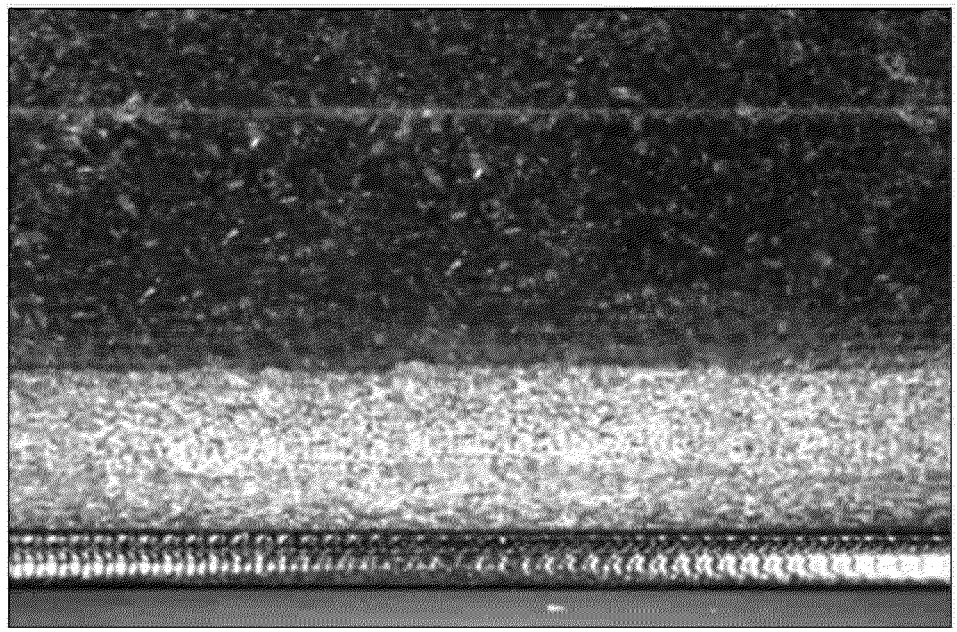
FIGS. 5B and 5C are pictures illustrating an area C of the side member of FIG. 4.
Figure 5C:
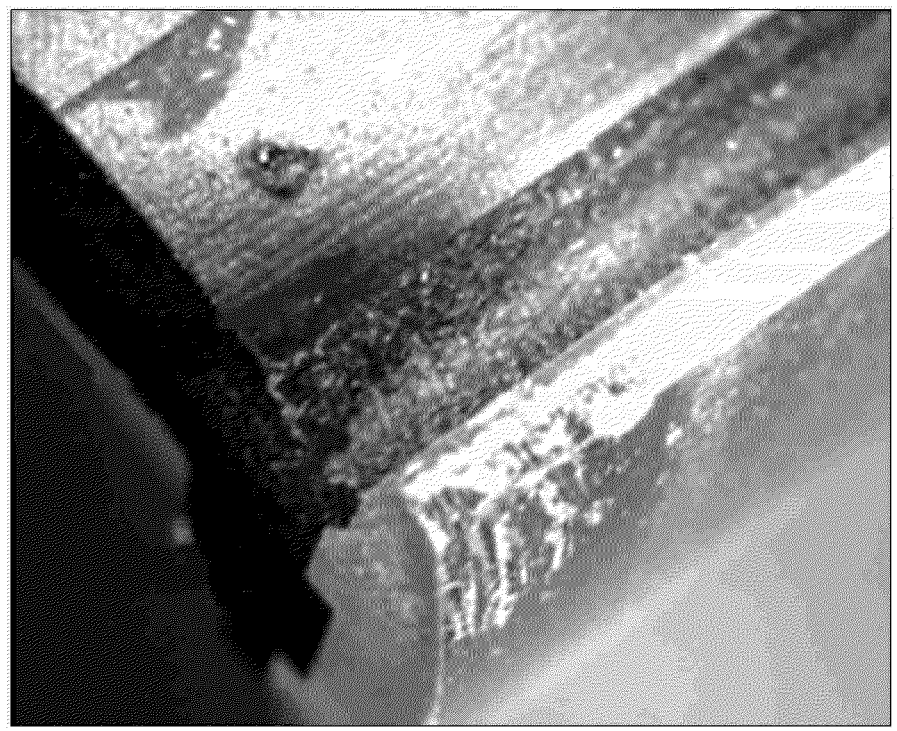

FIG. 4 is a rear perspective view illustrating a side frame 310 according to certain embodiments of the disclosure. FIG. 5A is a partial cross-sectional view illustrating the side frame 310 taken along line A-A' of FIG. 4. FIGS. 5B and 5C are pictures illustrating an area C of the side frame 310 of FIG. 4.

In describing the disclosure, a partial cross section of the third side surface 3105 is illustrated and described, but the first side surface 3103, the second side surface 3104, and the fourth side surface 3106 may also have the same cross-sectional configuration.

With reference to FIGS. 4 to 5C, the side frame 310 may include the side surfaces 3103, 3104, 3105, and 3106 and the support 3111 at least partially extended in a direction of an internal space of the electronic device (e.g., the electronic device 300 of FIG. 3) from the side surfaces 3103, 3104, 3105, and 3106. According to one embodiment, the side surfaces 3103, 3104, 3105, and 3106 may include a first side surface 3103 having a first length, a second side surface 3104 extended in a substantially perpendicular direction from the first side surface 3103 and having a second length smaller than the first length, a third side surface 3105 substantially parallel to the first side surface 3103 from the second side surface 3104 and having a first length, and a fourth side surface 3106 substantially parallel to the second side surface 3104 from the third side surface 3105 and having a second length. According to one embodiment, at least a portion of the side surface 3105 may include a conductive material. According to one embodiment, at least another portion of the support 3111 may include a polymer member 312 or polymer material. According to one embodiment, an integral unit of the side frame 310, and support 311 may be formed with the polymer member 312 formed in the conductive material through injection molding. In another embodiment, the side frame 310 may be formed in a manner that the polymer member 312 produced through an injection molding is assembled or bonded to the conductive material. According to one embodiment, the side frame 310 may include a polymer member 312 disposed to have a closed loop shape along an inner edge of the conductive side surfaces 3103, 3104, 3105, and 3106. According to one embodiment, the cover member (e.g., the rear plate 380 of FIG. 3) of the electronic device (e.g., the electronic device 300 of FIG. 3) may be attached to the polymer member 312 of the side frame 310 through an adhesive member (e.g., the adhesive 3801 of FIG. 3). According to one embodiment, the support 3111 of the side frame 310 may include at least one opening 3112 formed using injection molding. According to one embodiment, the opening 3112 may be used as a swelling hole for a battery (e.g., a battery 350 of FIG. 3) disposed inside the electronic device or a receiving space according to disposition of various electronic components.

According to certain embodiments, the conductive material may include at least part of the side frame 311a forming an external shape of the electronic device 300 and a support 311b extended in a direction of an internal space of the electronic device (e.g., the electronic device 300 of FIG. 3) from the side structure 311a. According to one embodiment, the polymer member 312 may be disposed to be coupled to at least a portion of the support 311/311b and the side frame 310 of the conductive material. According to one embodiment, the polymer member 312 may include a first area A1 facing at least a portion of the cover member (e.g., the rear plate 380 of FIG. 3) and to which the adhesive member (e.g., the adhesive 3801 of FIG. 3) is attached and a second area A2 extended from the first area A1 to at least a portion of the side frame 310. According to one embodiment, after injection molding, the first area A1 may include a non-machined area in which no machining process is performed and to which an adhesive member (e.g., the adhesive 3801 of FIG. 3) is attached. According to one embodiment, after an injection process using a mold, the second area A2 may include a machining area processed through a machining process (e.g., CNC process) together with the side structure 311a of the conductive material. According to one embodiment, the first area A1 of the polymer member 312 may include a flat surface 312a and a curved surface 312b extended from the flat surface 312a. According to one embodiment, the flat surface 312a may face a flat portion (e.g., the flat portion 380a of FIG. 7) of the cover (e.g., the rear plate 380 of FIG. 7). According to one embodiment, the curved surface 312b may face a curved portion (e.g., the curved portion 380b of FIG. 7) of the cover member (e.g., the rear plate 380 of FIG. 7). Therefore, even if the cover (e.g., the rear plate 380 of FIG. 7) is formed in a 3D shape having a curved portion (e.g., the curved portion 380b of FIG. 7), in the first area A1 of the polymer member 312 formed with an extrusion surface, the cover member may be smoothly attached through a flexible adhesive member (e.g., the adhesive 3801 of FIG. 7) (e.g., waterproof tape member) without separate attachment surface processing.

According to certain embodiments, the side frame 310 may include at least one slit structure 311c (e.g., T-cutting structure) formed at an inner side surface of the side frame 310 formed with the conductive material. According to one embodiment, by inducing expansion of a contact area of the polymer member 312 formed through an injection molding in the conductive material and through a slit structure 311c, the side member may increase a bonding force between the conductive material of the side frame 310 and support 311 with the polymer member 312. This may help improve impact resistance of the electronic device to withstand an external impact. It shall understood that with injection molding, the injected substance forms a reverse negative of a cavity that the injected substance is inserted into.

Figure 6:
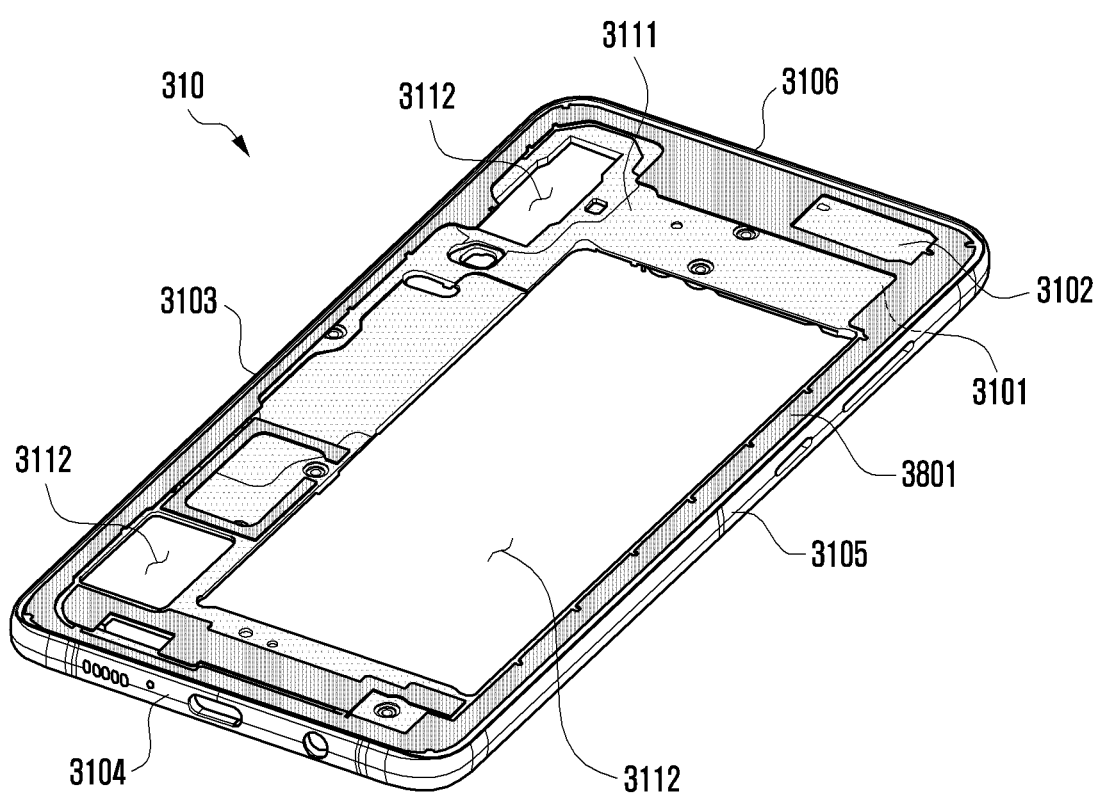
FIG. 6 is a perspective view illustrating an adhesive member attached to a side member according to certain embodiments of the disclosure.

FIG. 6 is a perspective view illustrating an adhesive 3801 attached to a side frame 310 according to certain embodiments of the disclosure.

Figure 7:
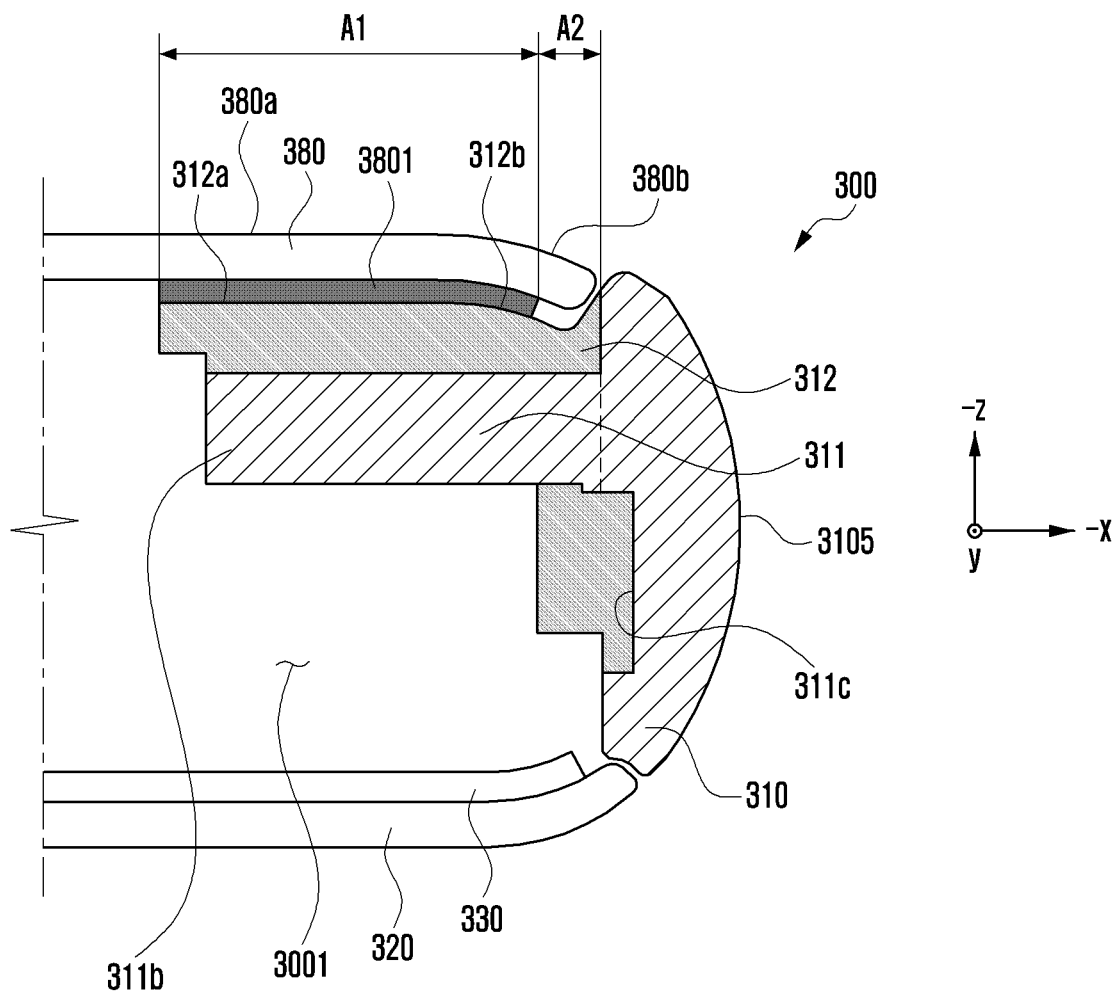
FIG. 7 is a partial cross-sectional view illustrating an electronic device according to certain embodiments of the disclosure.

With reference to FIG. 6, the side frame 310 may include an adhesive 3801 disposed in an area (e.g., generally an edge area of the cover member) at least partially facing the cover (e.g., the rear plate 380 of FIG. 7). According to one embodiment, the adhesive 3801 may be attached to the conductive material of the side frame 310 through the above-described first area (e.g., the first area A1 of FIG. 5A) of the polymer member 312 formed through injection molding. According to one embodiment, the adhesive 3801 may be formed in a closed loop shape so as to be attached along the side surfaces 3103, 3104, 3105, and 3106. According to one embodiment, the adhesive 3801 may have a bonding function of attaching the cover (e.g., the rear plate 380 of FIG. 7) and the side frame 310 and preventing moisture and/or foreign materials introduced into a gap between the side frame 310 and the cover member (e.g., the rear plate 380 of FIG. 7) from entering into the electronic device. According to one embodiment, the adhesive 3801 may include at least one of a tape, an adhesive, waterproof dispensing material, silicone, waterproof rubber, or urethane.

FIG. 7 is a partial cross-sectional view illustrating an electronic device 300 according to certain embodiments of the disclosure. FIG. 7 is a partial cross-sectional view illustrating the electronic device 300 taken along line B-B' of FIG. 2.

In FIG. 7, the same reference numerals are given to the same elements as those of FIG. 5A, and a detailed description thereof is omitted.

With reference to FIG. 7, the electronic device 300 may include a front plate 320 (e.g., front cover) facing in a first direction (e.g., z axis direction), a rear plate 380 (e.g., rear cover) facing in a direction (e.g., -z axis direction) opposite to that of the front plate 320, and a side frame 310 enclosing a space 3001 between the front plate 320 and the rear plate 380. According to one embodiment, the electronic device 300 may include a display 330 disposed to be visible in the internal space 3001 from the outside through at least a portion of the front plate 320. According to one embodiment, the display 330 may include a flexible display.

According to certain embodiments, the rear plate 380 may be disposed in at least a portion of the polymer member 312 of the side frame 310 through the adhesive 3801. According to one embodiment, the adhesive 3801 may be disposed in a first area A1, which is a non-machined area of the polymer member 312. According to one embodiment, a second area A2 extended from the first area A1 may be processed together with the side member 310. The first area A1 may include a flat surface 312a and a curved surface 312b extended from the flat surface 312a to the side frame 310. In another embodiment, the first area A1 may be formed only in the flat surface 312a. In another embodiment, the first area A1 may be formed only with the curved surface 312b.

According to certain embodiments, the rear plate 380 may be formed in a 3D shape having a flat portion 380a and a curved portion 380b extended from the flat portion 380a. According to one embodiment, when the rear plate 380 is attached to the polymer member 312 of the side frame 310 through the adhesive 3801, the flat portion 380a of the rear plate 380 may face the flat surface 312a of the polymer member 312 in the first area A1, and the curved portion 380b of the rear plate 380 may face the curved surface 312b of the polymer member 312 in the first area A1. According to one embodiment, because the first area A1 of the polymer member 312 may be formed to have a roughness value (e.g., roughness) (e.g., having generally low roughness) that may maximize an adhesive force of the adhesive 3801 through an injection process using a mold, unlike the conductive material, separate additional attachment surface processing (e.g., processing of the second area A2) is unnecessary; thus, a housing production time can be shortened.

Figure 8:
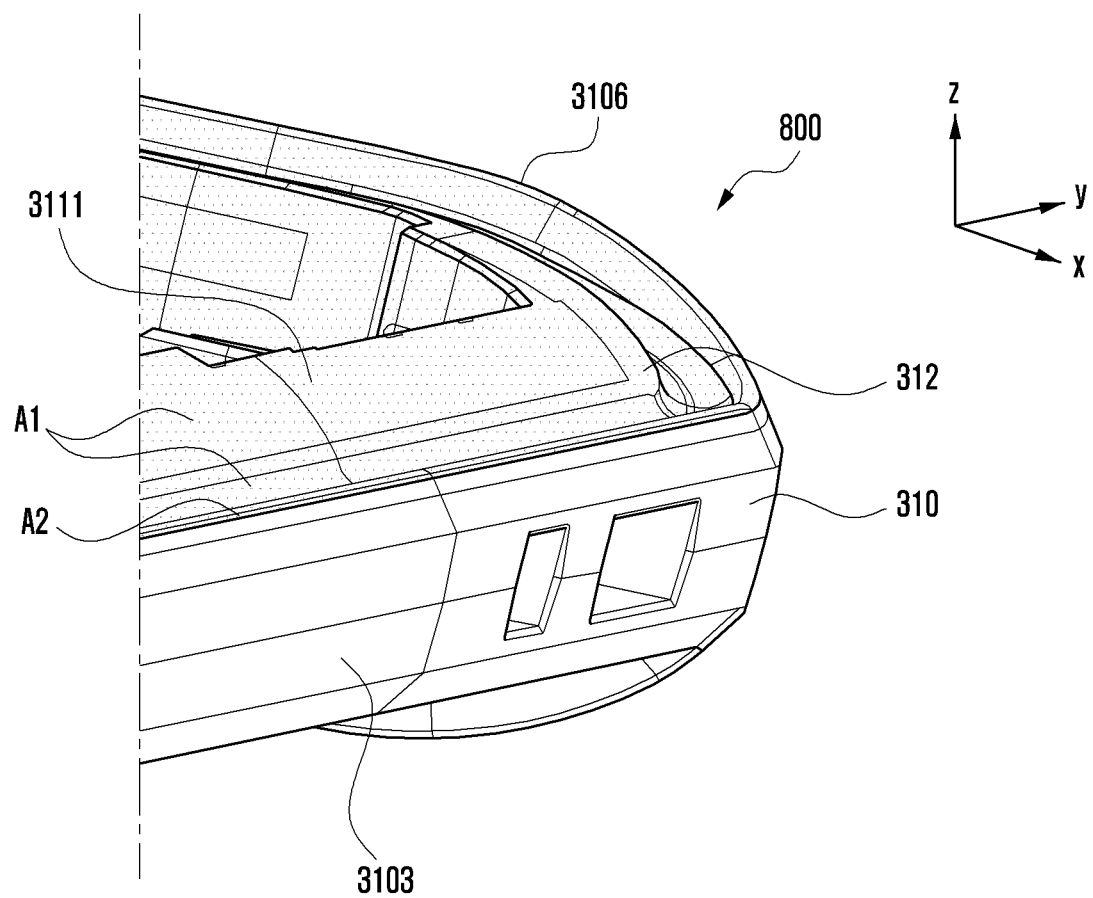
FIG. 8 is a partial perspective view illustrating a side member according to certain embodiments of the disclosure.

FIG. 8 is a partial perspective view illustrating a side member 800 according to certain embodiments of the disclosure.

With reference to FIG. 8, the side frame 800 (e.g., the side frame 310 of FIG. 7) may include a area A2 facing a front plate (e.g., the front plate 320 of FIG. 7). According to one embodiment, the first area A1 may be extended in a closed loop shape along an edge of the side surface 3103. The side surface 3103 may be made of conductive material. According to one embodiment, the first area A1 may be used as an attachment area of an adhesive member (e.g., the adhesive member 3201 of FIG. 3) for attaching the front plate (e.g., the front plate 320 of FIG. 7). According to one embodiment, the second area A2 may be extended from the first area A1 toward the side surface 3103 and be post-processed (e.g., CNC machined) together with the conductive material.

Figure 9:
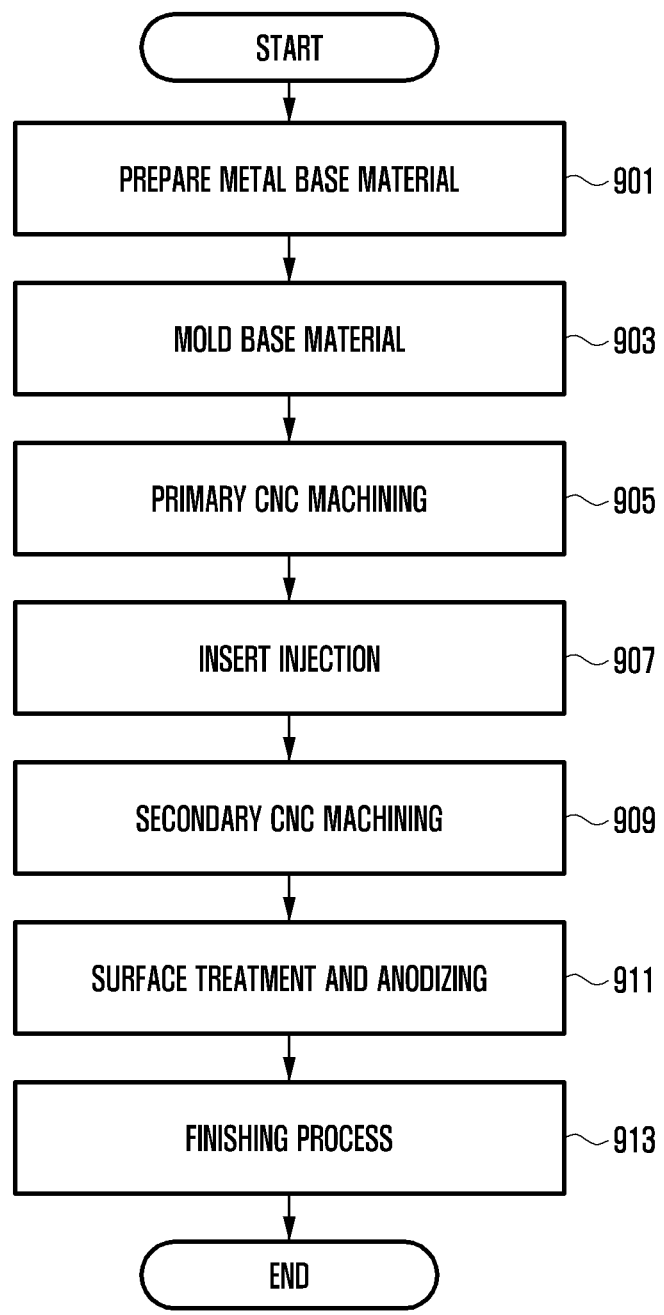
FIG. 9 is a flowchart illustrating a production process of a housing according to certain embodiments of the disclosure.

FIG. 9 is a flowchart illustrating a production process of a housing according to certain embodiments of the disclosure. FIGS. 10 to 15B are diagrams illustrating a production process of the housing of FIG. 9.

The production process of the housing (e.g., side member) of FIG. 9 may be described with reference to the configuration of FIGS. 10 to 15B.

With reference to FIG. 9, in operation 901, a metal base material may be prepared. According to one embodiment, the metal base material may be provided as a preform formed with an aluminum alloy of 6XXX series or 7XXX series. According to one embodiment, the metal base material may include an extruded material produced through an extrusion process and/or a rolled material produced through a rolling process. According to one embodiment, the metal base material may include an aluminum alloy base material extruded at an extrusion rate of at least 4 mm/sec of an aluminum alloy billet preheated to a temperature of about 440° C. to 500° C. In another embodiment, the metal base material may include a die casting material formed with a magnesium alloy or an aluminum alloy.

Figure 10:
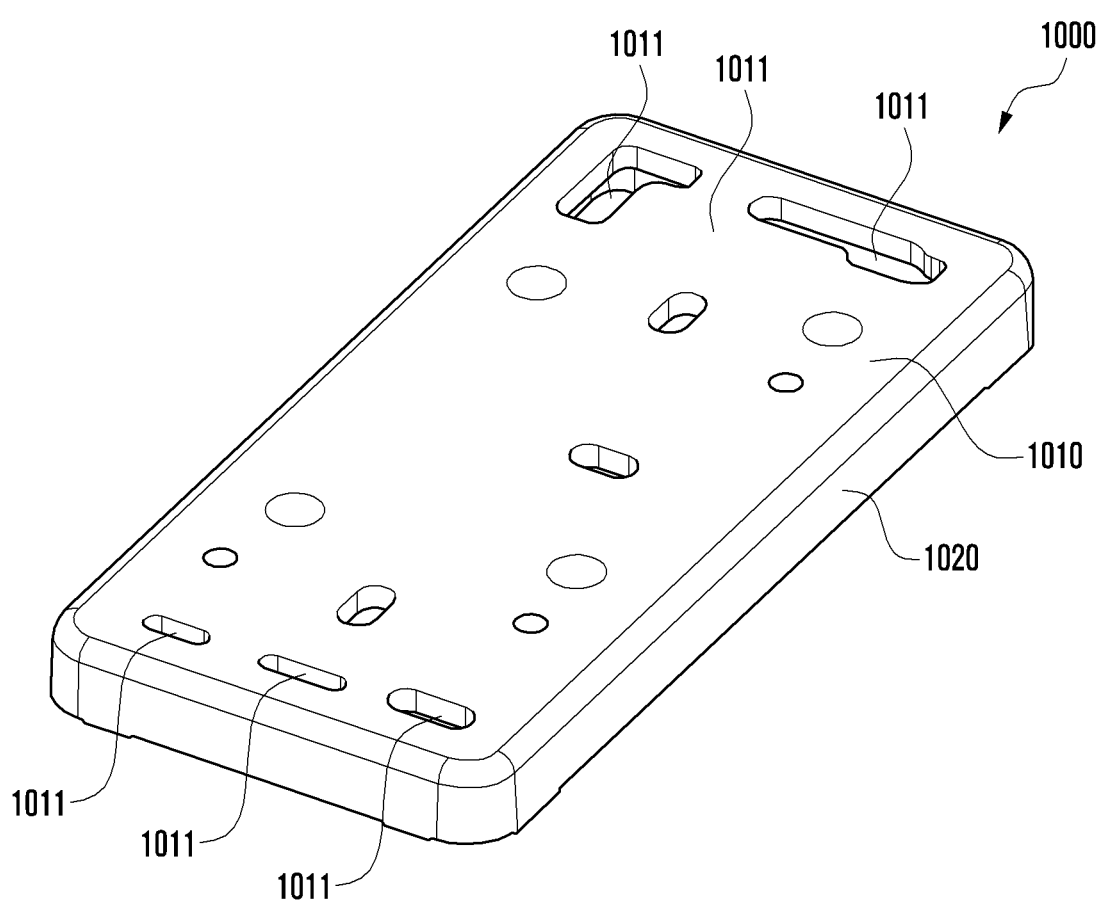
FIGS. 10 to 15B are diagrams illustrating a production process of the housing of FIG. 9.

According to certain embodiments, in operation 903, the metal base material may be molded into a primary produced material 1000 illustrated in FIG. 10. According to one embodiment, the primary produced material 1000 may be made of a metal base material of a heat treatment through a plurality of press processes (e.g., bending process, punching process, or piercing process). According to one embodiment, the primary produced material 1000 may include a front surface 1010 and a side surface 1020 having a predetermined height formed along an edge of the front surface 1010 through a molding process. According to one embodiment, the primary produced material 1000 may include at least one opening 1011 formed through a molding process. In another embodiment, the primary produced material 1000 may be formed through a die casting process using a die casting material.

Figure 11A:
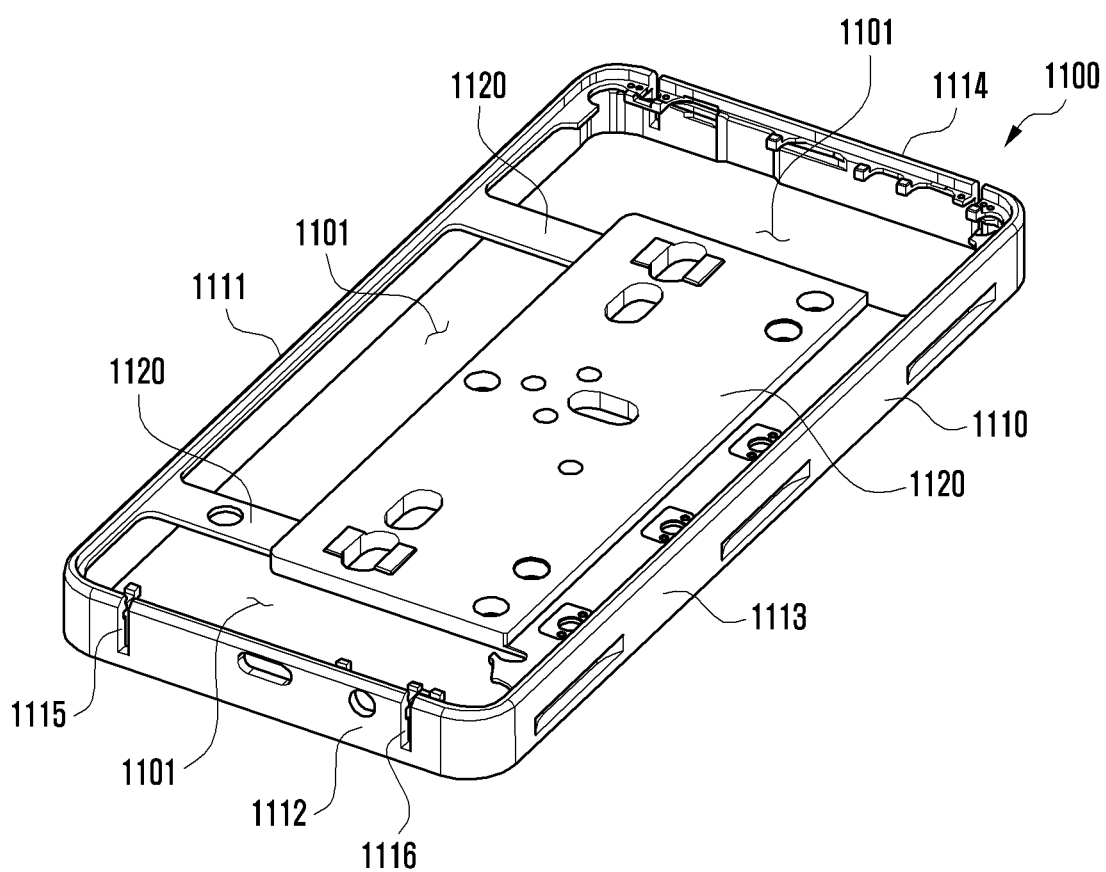
Figure 11B:
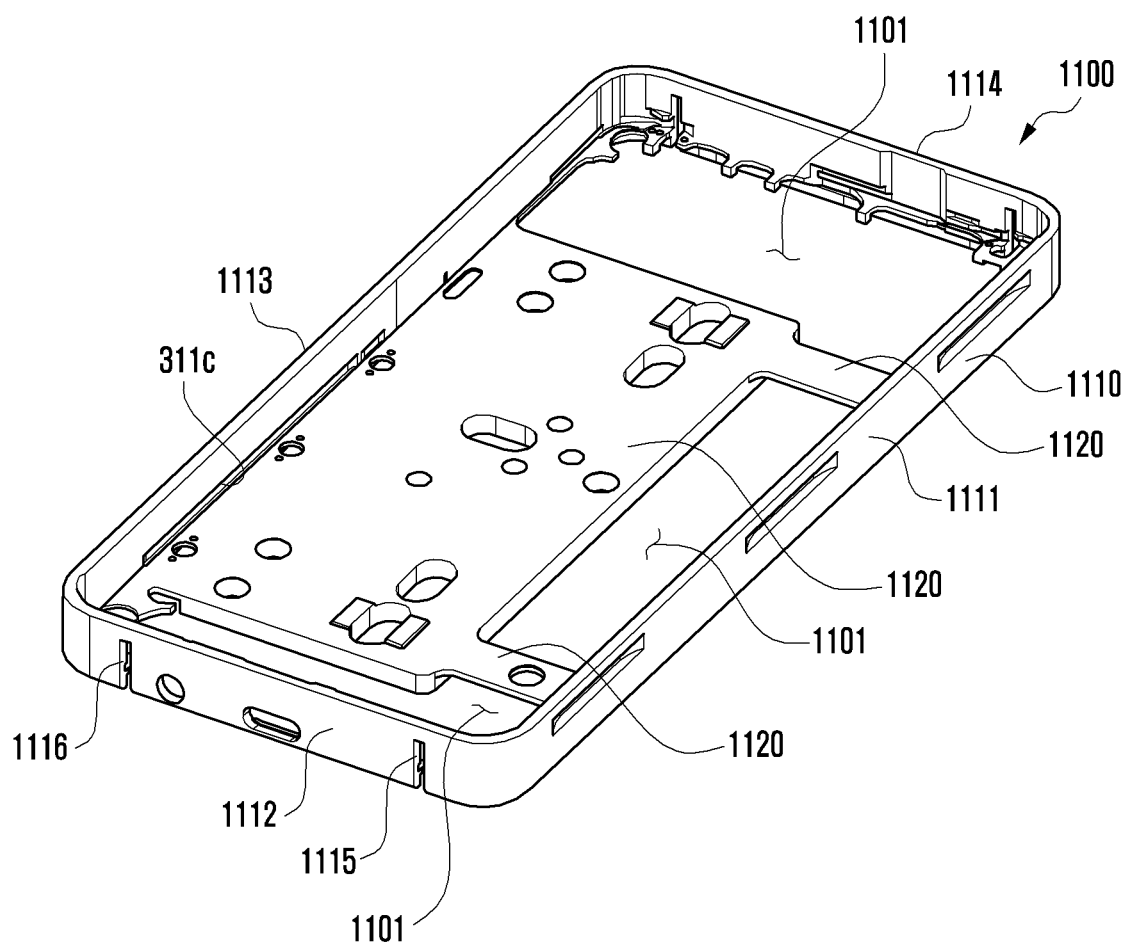

According to certain embodiments, in operation 905, the primary produced material 1000 may be formed into a secondary produced material 1100, as illustrated in FIGS. 11A and 11B through primary CNC machining. The secondary produced material 1100 may include a conductive member 1110. According to one embodiment, the secondary produced material 1100 formed through the primary CNC machining operation may have a shape of a side frame (e.g., the side frame 310 of FIG. 3) to some extent. For example, the secondary produced material 1100 may include the side surfaces (e.g., the side surfaces 3103, 3104, 3105, and 3106 of FIG. 3) of the above-described side member (e.g., the side frame 310 of FIG. 3) and side surfaces 1111, 1112, 1113, and 1114 corresponding thereto and include an injection space 1101 enclosed by the conductive material and formed with the polymer member through injection molding. According to one embodiment, the secondary produced material 1100 may include at least one electrifying bridge 1120 for an anodizing process. According to one embodiment, the secondary produced material 1100 may include a pair of segment slits 1115 and 1116 formed to be spaced apart at regular intervals in at least one side surface 1112. According to one embodiment, the segment slits 1115 and 1116 may receive the polymer member through injection molding, thereby inducing the formation of a conductive portion to be used as an antenna of the side frame. According to one embodiment, the secondary produced material 1100 may include a slit structure 311c formed at an inner surface of at least one side surface 1111 of the side surfaces 1111, 1112, 1113, and 1114.

Figure 12:
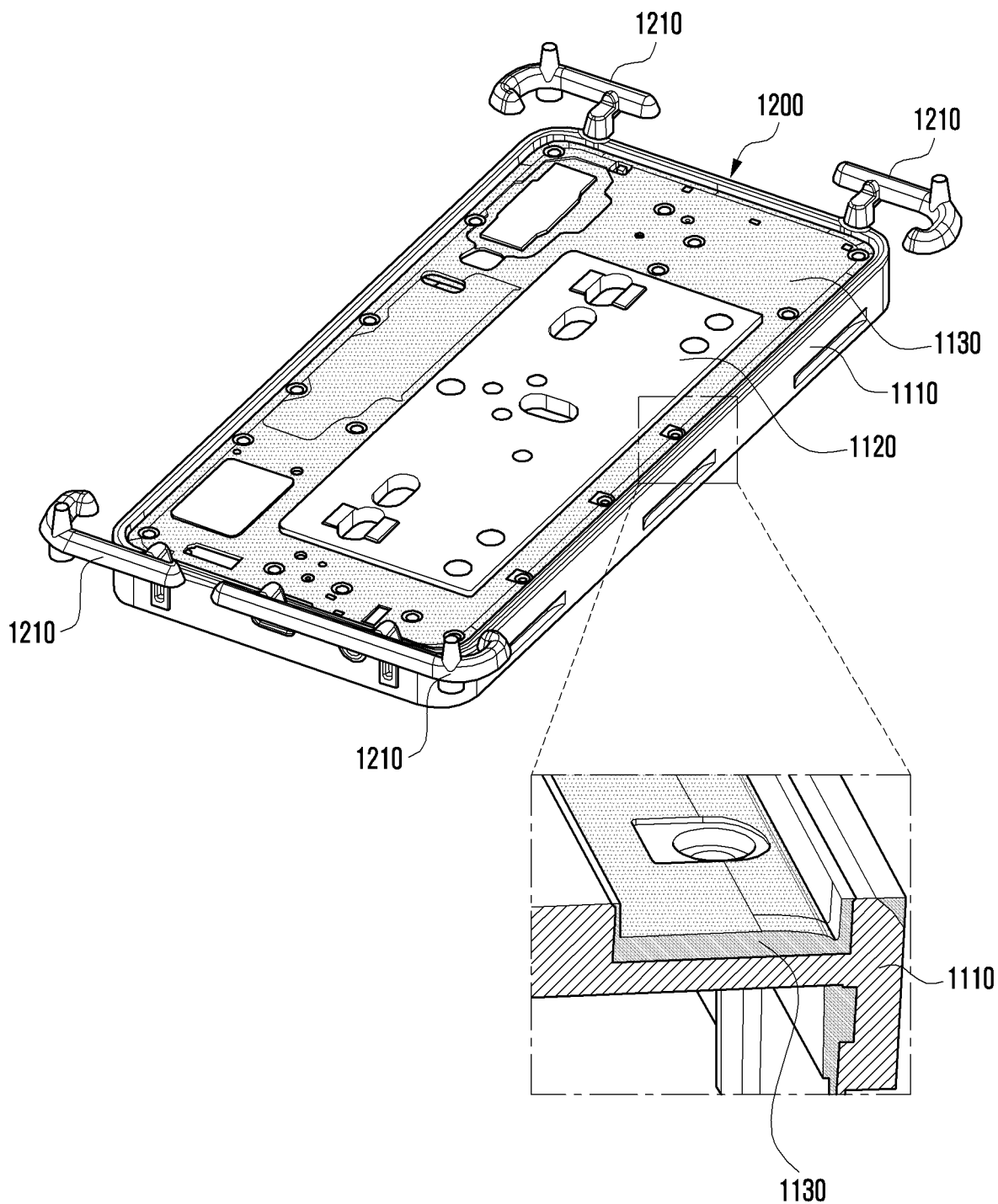

According to certain embodiments, in operation 907, a tertiary produced material 1200 having a polymer member 1130 coupled to the conductive material, which is the secondary produced material 1100, may be formed through injection molding. According to one embodiment, as illustrated in FIG. 12, the tertiary produced material 1200 may be formed through a resin injected through a nozzle 1210 of an injection mold using a hot runner method or a cold rubber method. According to one embodiment, the tertiary produced material 1200 may be formed through a side gate method. According to one embodiment, the tertiary produced material 1200 may include a polymer member 1130 coupled to the conductive material of the secondary produced material 1100 through a resin including a rigidity reinforcing material. According to one embodiment, the rigidity reinforcing material may include at least one inorganic filler. According to one embodiment, the rigidity reinforcing material may include at least one of glass fiber (GF), mineral filler (MF), carbon fiber (CF), talc, or cellulose nano fiber (CNF). According to one embodiment, the resin may include a rigidity reinforcing material in a range of about 10 wt % to 65 wt % in a thermoplastic resin. In another embodiment, the resin may include about 30 wt % of GF in the thermoplastic resin. In this case, in order to include a first area (e.g., the first area A1 of FIG. 7) and a second area (e.g., the second area A2 of FIG. 7) of the above-described side member (e.g., the side frame 310 of FIG. 7), the polymer member 1130 may be formed through an injection molding.

Figure 13A:
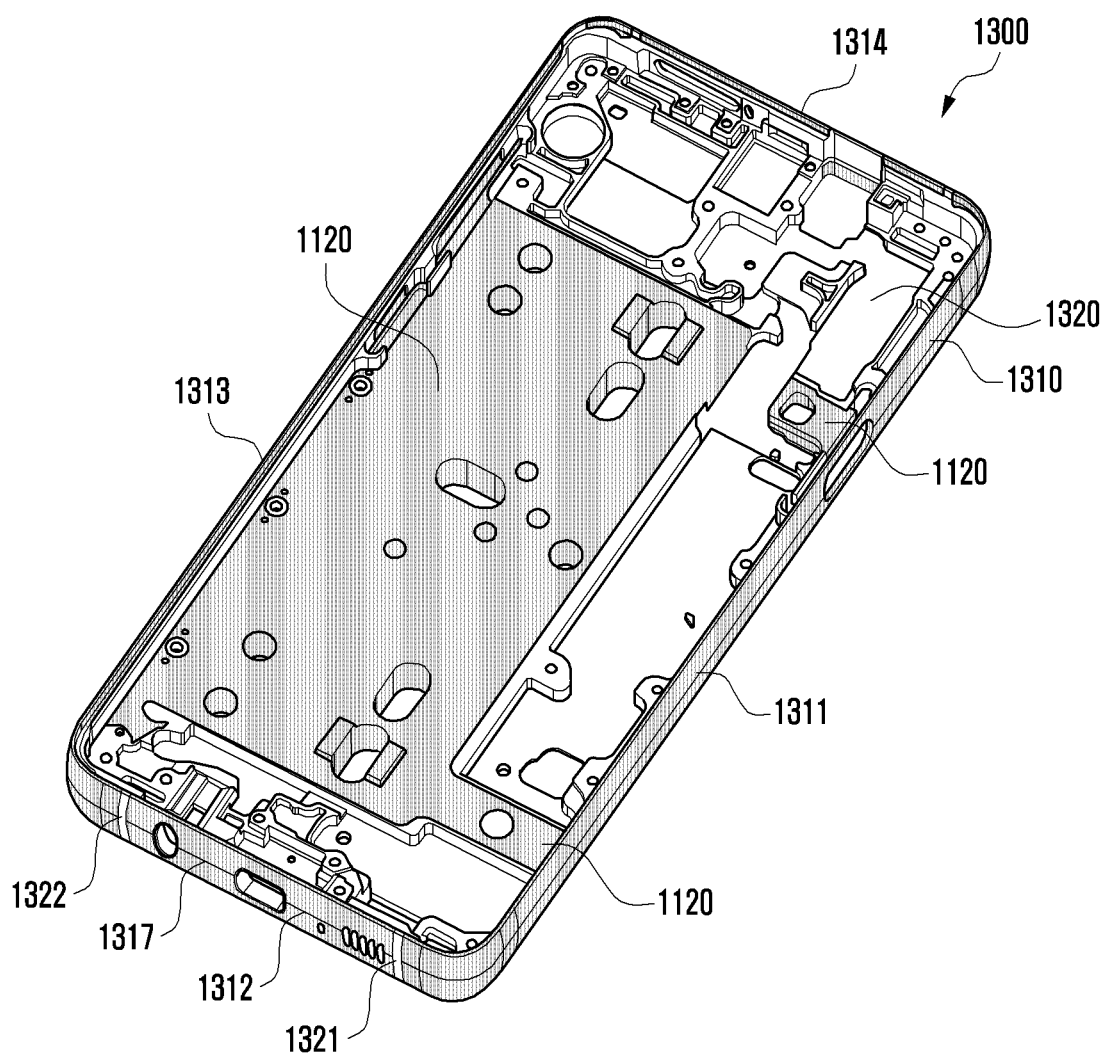

In operation 909, the tertiary produced material 1200 may be formed into the quartic produced material 1300 as illustrated in FIG. 13A through secondary CNC machining. According to one embodiment, the quartic produced material 1300 may be formed in a shape of a side member (e.g., the side frame 310 of FIG. 3) substantially including side surfaces 1311, 1312, 1313, and 1314 (e.g., the side surfaces 3103, 3104, 3105, and 3106 of FIG. 3) of an electronic device (e.g., the electronic device 300 of FIG. 3) through secondary CNC machining. The quartic produced material 1300 may include segment portions 1321 and 1322 formed by filling the segment slits 1115 and 1116 of the secondary produced material 1100 of FIGS. 11A and 11B formed with the polymer member 1320 formed in the conductive member 1310 through an injection process using a mold. According to one embodiment, a conductive portion 1317 formed to be electrically insulated from a peripheral conductive member through the segment portions 1321 and 1322 may be used as an antenna.

Figure 13B:
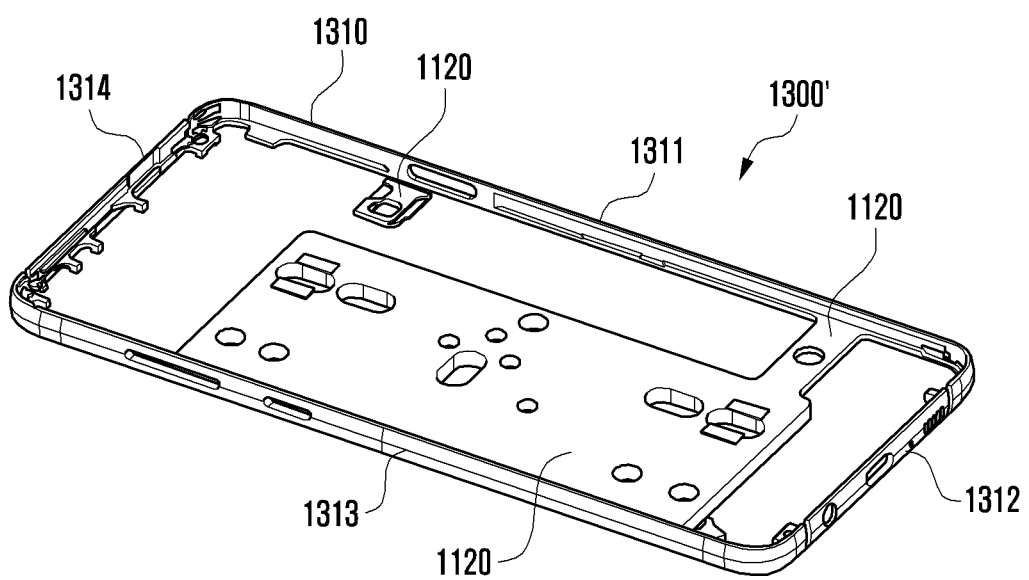
Figure 14:
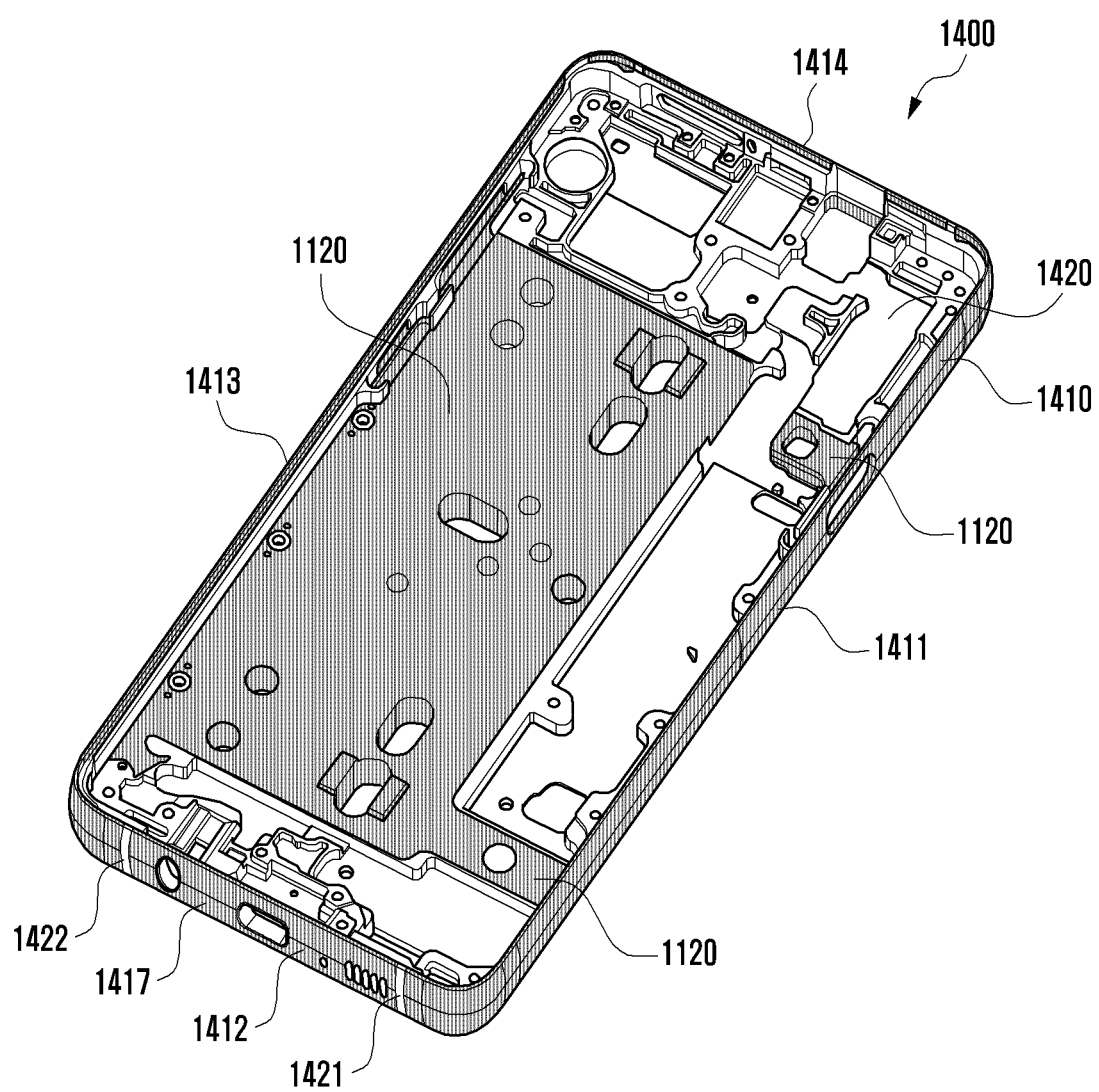

FIG. 13B is a diagram illustrating a quartic produced material 1300' of FIG. 13A in which the polymer member 1320 is omitted, and in FIG. 13B at least one electrifying bridge 1120 may still remain. The electrifying bridge 1120 may be connected from the first side surface 1311 to the third side surface 1313 across an internal space for an anodizing process or may include an electrifying electrode disposition structure for an anodizing process.

According to certain embodiments, in operation 911, the quartic produced material 1300 may be formed into a quintic produced material 1400 through a surface treatment process, and an anodizing process. According to one embodiment, the quintic produced material 1400 includes side surfaces 1411, 1412, 1413, and 1414 (e.g., the side surfaces 3103, 3104, 3105, and 3106 of FIG. 3) formed with the conductive member 1410 and may be formed in a shape of a side member (e.g., the side frame 310 of FIG. 3) including a polymer member 1420 formed through an injection process using a mold in an internal space enclosed by the conductive material 1410. According to one embodiment, the quintic produced material 1400 may include a conductive portion 1417 electrically insulated from a peripheral conductive member through a pair of segment portions 1421 and 1422. According to one embodiment, the quintic produced material 1400 may be colored in at least one color through an anodizing process.

Figure 15A:
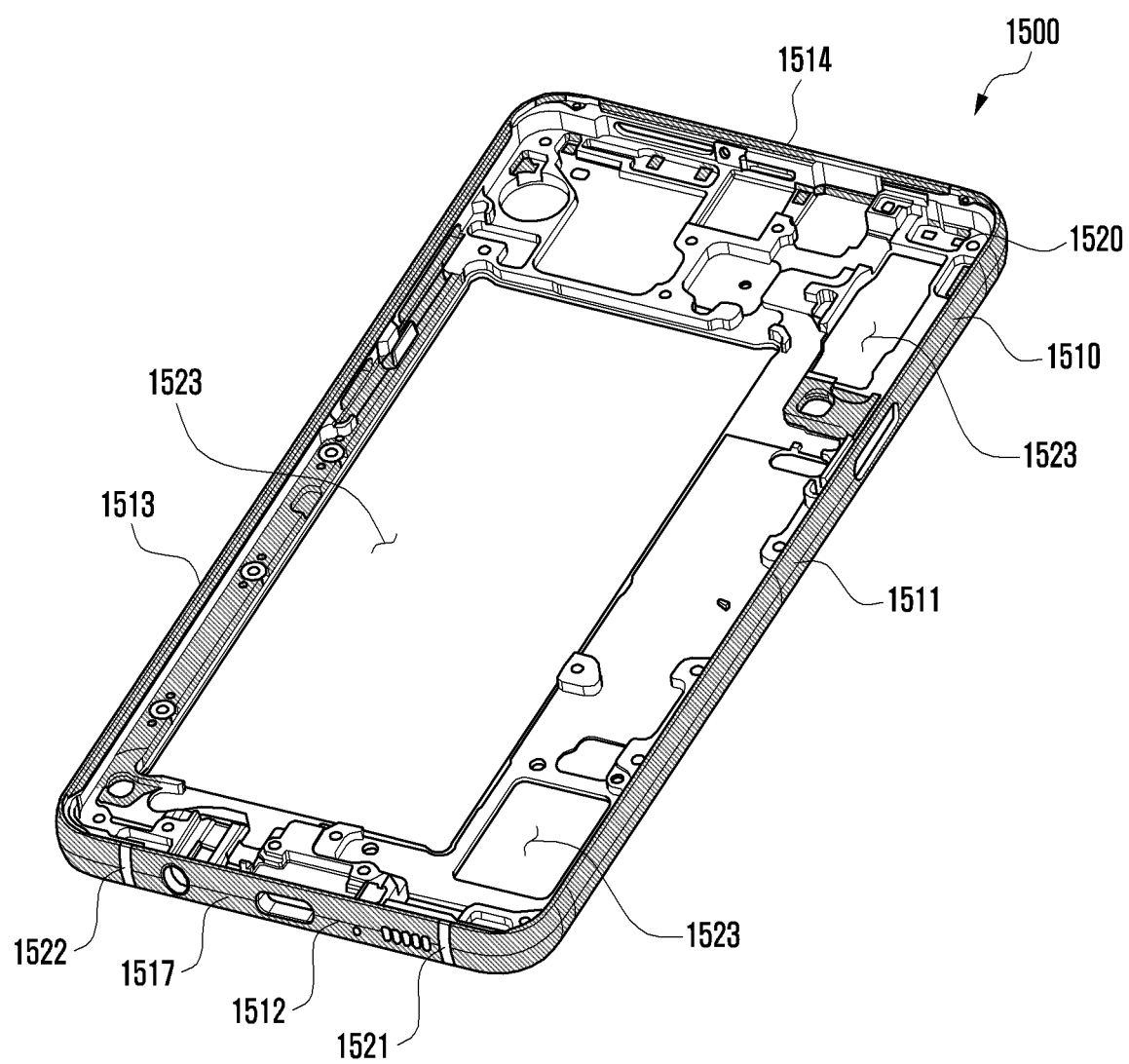
Figure 15B:
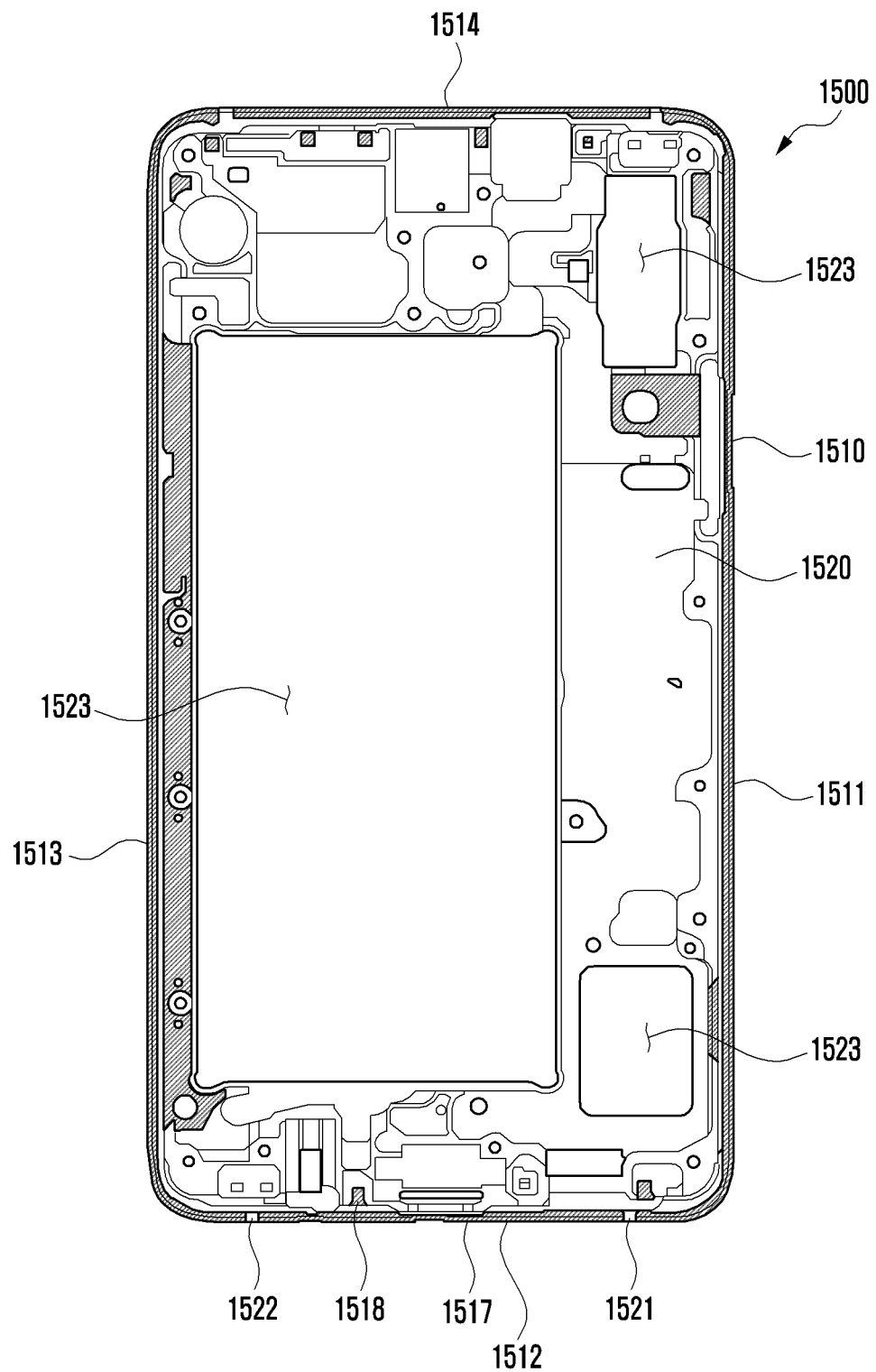

According to certain embodiments, in operation 913, as illustrated in FIGS. 15A and 15B, the quintic produced material 1400 may be formed into a sextic produced material 1500 through a finishing process. According to one embodiment, the sextic produced material 1500 may include side surfaces 1511, 1512, 1513, and 1514 (e.g., the side surfaces 3103, 3104, 3105, and 3106 of FIG. 3) formed with a conductive material 1510, and may be formed in substantially the same shape as that of the side frame 310 of FIG. 3 and including a polymer member 1520 formed through injection molding in an internal space enclosed by the conductive member 1510. According to one embodiment, the finishing process may include a computer numerical control. (CNC) process of removing the electrifying bridge (e.g., the electrifying bridge 1120 of FIG. 14) included in the quintic produced material 1400. According to one embodiment, the finishing process may include a process of processing at least a portion of a colored area through an anodizing process of the quintic produced material 1400 through a machine tool such as a milling machine. For example, the sextic produced material 1500 may receive additional processing (e.g., milling processing) in which a colored area is processed at least partially into a flat surface and/or a curved surface through a mold tool. According to one embodiment, the sextic produced material 1500 may include a polymer member 1520 extended into an internal space from side surfaces 1511, 1512, 1513, and 1514 formed with a conductive member 1510 and including at least one opening 1523 (e.g., swelling hole or electronic component receiving space). According to one embodiment, the sextic produced material 1500 may include a conductive portion 1517 electrically insulated through a pair of segment portions 1521 and 1522. According to one embodiment, the sextic produced material 1500 may include an island-type conductive contact point 1518 exposed from the polymer member 1520 near the conductive portion 1517. According to one embodiment, the conductive contact point 1518 may be electrically connected to the conductive portion 1517 through a conductive connection portion embedded in the polymer member 1520. According to one embodiment, in an injection process using a mold, the conductive contact point 1518 may be at least partially embedded in the polymer member 1520, be electrically connected to the conductive portion 1517, and be electrically connected to a wireless communication circuit mounted in a printed circuit board (e.g., the printed circuit board 340 of FIG. 3) of the electronic device (e.g., the electronic device 300 of FIG. 3).

Figure 16:
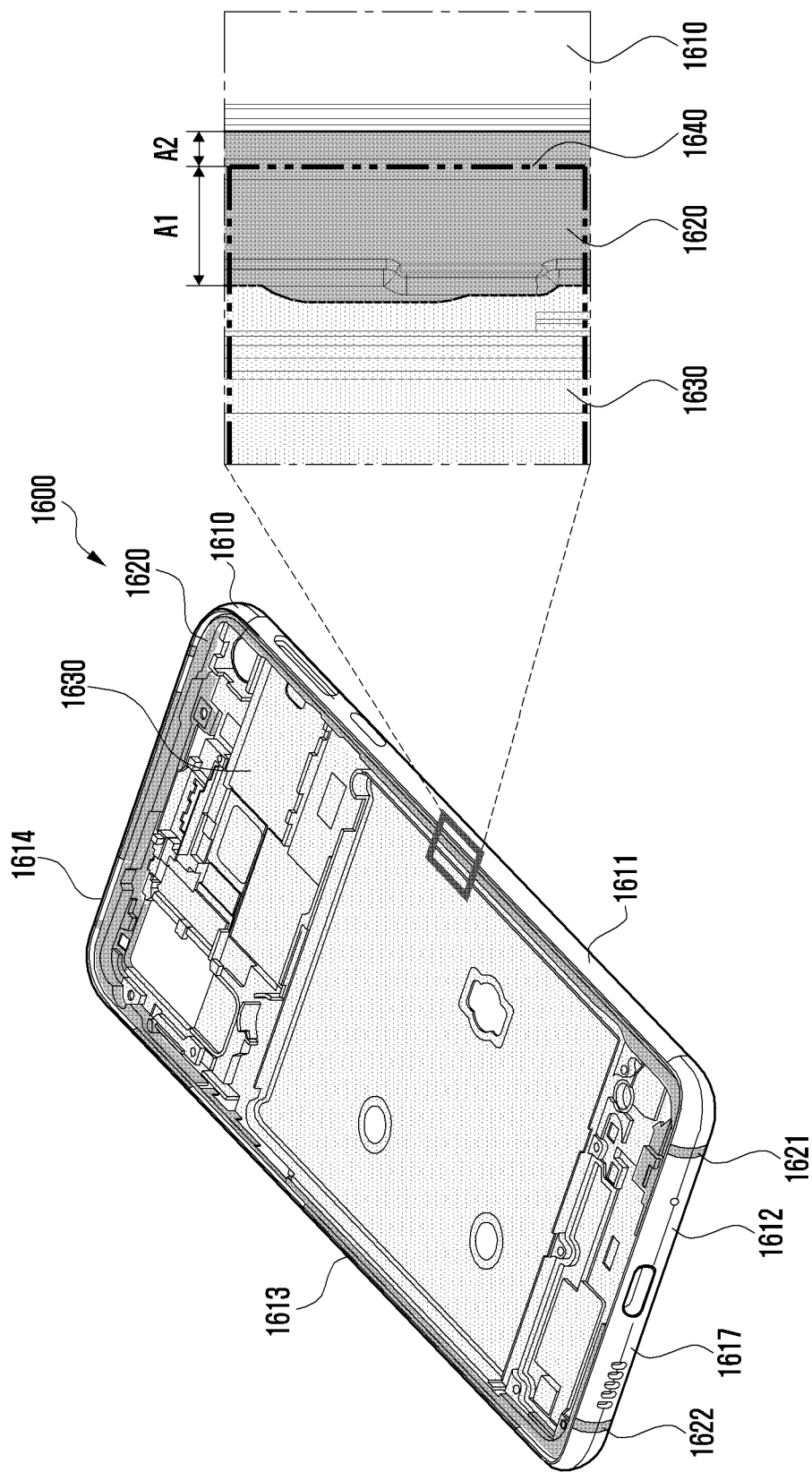
FIG. 16 is a perspective view illustrating a side member according to certain embodiments of the disclosure.

FIG. 16 is a perspective view illustrating a side member 1600 according to certain embodiments of the disclosure.

With reference to FIG. 16, the side frame 1600 (e.g., housing) in which production is finally completed may include a first side surface 1611 having a first length, a second side surface 1612 extended in a substantially perpendicular direction from the first side surface 1611 and having a length smaller than the first length, a third side surface 1613 substantially parallel to the first side surface 1611 from the second side surface 1612 and having the first length, and a fourth side surface 1614 extending from the third side surface 1613 to the first side surface 1611 and having a second length substantially parallel to the second side surface 1612. According to one embodiment, the side frame 1600 may include conductive material 1610 forming at least a portion (e.g., a portion of a side surface) of an external shape of an electronic device (e.g., the electronic device 300 of FIG. 3), a polymer member 1620 formed along an inner edge of the first conductive member 1610, and a second conductive member 1630 extended to at least a portion of an internal space of the electronic device. According to one embodiment, at least a portion of the second conductive member 1630 may be used as a rigidity reinforcing support member (e.g., the support member 3111 of FIG. 3) at the inside of the electronic device (e.g., the electronic device 300 of FIG. 3). According to one embodiment, the first conductive member 1610 may be formed through a press process and a CNC process using a rolled material or an extruded material such as an aluminum alloy. According to one embodiment, the second conductive member 1630 may be formed through a die casting process using a die casting material such as an aluminum alloy or a magnesium alloy. According to one embodiment, the polymer member 1620 may be formed in a closed loop shape along an inner edge of the side surfaces 1611, 1612, 1613, and 1614 of the first conductive member 1610. According to one embodiment, in order to prevent an electric shock problem, the first conductive member 1610 may be disposed to be insulated from the second conductive member 1630 through the polymer member 1620.

According to certain embodiments, the polymer member 1620 may include a pair of segment portions 1621 and 1622 filled in a pair of slits formed to be spaced apart from at least some side surfaces 1612 of the first conductive member 1610 to form the conductive portion 1617 electrically disconnected from a peripheral conductive member 1615. According to one embodiment, the conductive portion 1617 may be used as an antenna radiating element.

According to certain embodiments, the polymer member 1620 disposed between the first conductive member 1610 and the second conductive member 1630 may include a first area A1 to which an adhesive member 1640 may be attached and a second area A2 extended from the first area A1 to the first conductive member 1610 and that may be post-processed. According to one embodiment, in order to maximize an adhesive force of the adhesive member 1640, a roughness value of the first area A1 may be formed lower than that of the second area A2. In another embodiment, the adhesive member 1640 may include the first area A1 and may be attached to at least a portion of the second conductive member 1630.

According to certain embodiments of the disclosure, in a housing of heterogeneous materials, because an attachment surface with the cover member includes an injection surface formed with a polymer member through an injection process using a mold, post-processing of the attachment surface is not required, a production time can be shortened and a production cost can be reduced, and a 2D-shaped cover member and a 3D-shaped cover member can be easily attached.

According to certain embodiments, an electronic device (e.g., electronic device 300 of FIG. 7) includes at least one cover member (e.g., the rear plate 380 of FIG. 7) including a flat portion (e.g., the flat portion 380a of FIG. 7) and a curved portion (e.g., the curved portion 380b of FIG. 7) extended in an edge direction from the flat portion; a side member (e.g., the side frame 310 of FIG. 7) at least partially facing the at least one cover member; and at least one adhesive member (e.g., the adhesive material 3801 of FIG. 7) disposed between the at least one cover member and the side member, wherein the side member as a conductive member (e.g., the conductive material of FIG. 7) includes a side structure (e.g., the side structure 311a of FIG. 7) forming at least partially an external shape of the electronic device and including a first side surface (e.g., the first side surface 3103 of FIG. 3), a second side surface (e.g., the second side surface 3104 of FIG. 3) extended in a vertical direction from the first side surface, a third side surface (e.g., the third side surface 3105 of FIG. 3) extended parallel to the first side surface from the second side surface, and a fourth side surface (e.g., the fourth side surface 3106 of FIG. 3) extended from a third side surface to the first side surface and extended parallel to the second side surface; a conductive member including a support structure (e.g., the support structure 311b of FIG. 7) extended at least partially from the side structure to an internal space (e.g., the internal space 3001 of FIG. 7) of the electronic device; and a polymer member (e.g., the polymer member 312 of FIG. 7) coupled to at least a portion of the support structure and/or the side structure and at least partially facing the at least one cover member, wherein the polymer member includes a flat surface (e.g., the flat surface 312a of FIG. 7) corresponding to the flat portion and a curved surface (e.g., the curved surface 312b of FIG. 7) extended from the flat surface and corresponding to the curved portion, and includes a first area (e.g., the first area A1 of FIG. 7) in which the adhesive member is disposed and a second area (e.g., the second area A2 of FIG. 7) extended from the first area and contacting the side structure.

According to certain embodiments, the first area may include an area having a first roughness value formed in the conductive member through an injection process using a mold.

According to certain embodiments, the second area may include an area formed in the conductive member through an injection process using a mold and having a second roughness value different from the first roughness value.

According to certain embodiments, the second area may be processed together with at least a portion of the side structure of the conductive member.

According to certain embodiments, the first area may have a closed loop shape along an inner edge of the first side surface, the second side surface, the third side surface, and the fourth side surface.

According to certain embodiments, the electronic device may further include a slit structure (e.g., the slit structures 311c of FIG. 7) recessed at least partially at an inner side surface of the side structure of the conductive member, wherein the polymer member may be filled in the slit structure in an injection process using a mold. According to certain embodiments, the first side surface and the third side surface may be formed in a first length, and the second side surface and the fourth side surface may be formed in a second length smaller than the first length.

According to certain embodiments, the at least one adhesive member may include at least one of a tape, an adhesive, waterproof dispensing material, silicone, waterproof rubber, or urethane.

According to certain embodiments, the at least one cover member may include at least partially the first area when viewed from above the at least one cover member and be disposed to overlap to the second area.

According to certain embodiments, the electronic device may further include a front cover (e.g., the front plate 320 of FIG. 7) facing in a first direction; and a rear cover (e.g., the rear plate 380 of FIG. 7) facing in a direction opposite to that of the front cover, wherein the at least one cover may include the front cover or the rear cover.

According to certain embodiments, the electronic device may further include a display (e.g., the display 330 of FIG. 7) disposed to be at least partially visible in an internal space thereof from the outside through the front cover.

According to certain embodiments, when the at least one cover member includes a front cover, the at least one adhesive member may be disposed between the display and the first area.

According to certain embodiments, the conductive member may include a conductive portion (e.g., the conductive portion 1180 of FIG. 1) formed through a pair of slits (e.g., the slits 1115 and 1116 of FIG. 11A) spaced apart at regular intervals in the side structure, and wherein the polymer member may be extended from the first area to the pair of slits.

According to certain embodiments, the electronic device may further include a wireless communication circuit disposed in an internal space of the electronic device, wherein the conductive portion may be electrically connected to the wireless communication circuit.

According to certain embodiments, an electronic device (e.g., the electronic device 300 of FIG. 7) includes a front cover (e.g., the front plate 320 of FIG. 7); a rear cover (e.g., the rear plate 380 of FIG. 7) facing in a direction opposite to that of the front cover; and a side member (e.g., the side frame 310 of FIG. 7) enclosing a space (e.g., the space 3001 of FIG. 7) between the front cover and the rear cover, wherein the side member includes a conductive member (e.g., the conductive material of FIG. 7) including a side structure (e.g., the side structure 311a of FIG. 7) at least partially forming an external shape of the electronic device and a support structure (e.g., the support structure 311b of FIG. 7) at least partially extended from the side structure to the space; and a polymer member (e.g., the polymer member 312 of FIG. 7) coupled to at least a portion of the support structure and/or the side structure, wherein the polymer member includes a first area (e.g., the first area A1 of FIG. 7) in which an adhesive member (e.g., the adhesive 3801 of FIG. 7) for attachment of the front cover and/or the rear cover is disposed and a second area (e.g., the second area A2 of FIG. 7) extended from the first area and contacting the side structure.

According to certain embodiments, the first area may include an area having a first roughness value formed in the conductive member through an injection process using a mold.

According to certain embodiments, the second area may include an area formed in the conductive member through an injection process using a mold and having a second roughness value different from the first roughness value.

According to certain embodiments, the second area may be processed together with at least a portion of the side structure of the conductive member.

According to certain embodiments, the first area may have a closed loop shape along an inner side edge of the side structure.

According to certain embodiments, the electronic device may further include a display (e.g., the display 330 of FIG. 7) disposed to be at least partially visible in an internal space thereof from the outside through the front cover and the adhesive member may be disposed between the display and the first area.

The embodiments of the disclosure disclosed in this specification and drawings only present a specific example in order to easily describe the technical contents according to one embodiment of the disclosure and to help an understanding of the embodiments of the disclosure, and they do not intend to limit the scope of the embodiments of the disclosure. Accordingly, all changes or modifications derived from the technical idea of certain embodiments of the disclosure in addition to the embodiments described herein should be construed as being included in the scope of certain embodiments of the disclosure.

What is claimed is:

1. An electronic device, comprising:
a rear cover comprising a flat portion and a curved portion extending from at least one edge of the flat portion;
a side frame connected to the rear cover, the side frame forming at least partially an external shape of the electronic device and comprising:
a first side surface, a second side surface extended substantially perpendicularly from the first side surface, a third side surface substantially parallel to the first side surface and substantially perpendicular to the second side surface, and a fourth side surface extended substantially perpendicular from the third side surface and the first side surface and substantially parallel to the second side surface;
a first adhesive disposed between the rear cover and the side frame;
a support extending at least partially from the side frame to an internal space of the electronic device, wherein the support comprises conductive material; and
a polymer member coupled to at least a portion of the support or the side frame and at least partially facing the rear cover,
wherein the polymer member comprises a flat surface corresponding to the flat portion of the rear cover and a curved surface extending from the flat surface and corresponding to the curved portion of the rear cover, and comprises a first area in which the first adhesive is disposed and a second area extended from the first area and contacting the side frame.

2. The electronic device of claim 1, wherein the first area comprises an area having a first roughness value formed on the support.

3. The electronic device of claim 2, wherein the second area comprises an area formed under the support and along the side frame, the second area having a second roughness value different from the first roughness value.

4. The electronic device of claim 3, wherein the second area is processed together with at least a portion of the side frame.

5. The electronic device of claim 1, wherein the first area has a closed loop shape along an inner edge of the first side surface, the second side surface, the third side surface, and the fourth side surface.

6. The electronic device of claim 1, further comprising a slit structure recessed at least partially at an inner side surface of the side frame,
wherein the polymer member fills and forms a reverse negative of the slit structure.

7. The electronic device of claim 1, wherein the first side surface and the third side surface are formed in a first length, and the second side surface and the fourth side surface are formed in a second length smaller than the first length.

8. The electronic device of claim 1, wherein the first adhesive comprises at least one of a tape, waterproof dispensing material, silicone, waterproof rubber, or urethane.

9. The electronic device of claim 1, wherein the rear cover overlaps the first area and at least a part of the second area when viewed from above the rear cover.

10. The electronic device of claim 1, further comprising a front cover connected to the side frame,
wherein the rear cover faces a first direction, and the front cover faces a second direction opposite the first direction.

11. The electronic device of claim 10, further comprising a display disposed to be at least partially visible in the internal space of the electronic device from outside the front cover.

12. The electronic device of claim 11, further comprising a second adhesive disposed between the display and the support, when the display is exposed through the front cover.

13. The electronic device of claim 1, wherein the conductive material forms a conductive portion formed through a pair of slits spaced apart at regular intervals in the side frame, and
wherein the polymer member is extended from the first area to the pair of slits.

14. The electronic device of claim 13, further comprising a wireless communication circuit disposed in the internal space of the electronic device,
wherein the conductive material is electrically connected to the wireless communication circuit.

15. An electronic device, comprising:
a front cover;
a rear cover facing in a direction opposite to that of the front cover; and
a side frame enclosing a space between the front cover and the rear cover,
the side frame at least partially forming an external shape of the electronic device, the side frame comprising conductive material;
a support at least partially extended from the side frame to the space, the support comprising conductive material; and
a polymer member coupled to at least a portion of the support or the side frame,
wherein the polymer member comprises a first area in which a first adhesive member for attachment of the rear cover is disposed and a second area extended from the first area and contacting the side frame.

16. The electronic device of claim 15, wherein the first area comprises an area having a first roughness value formed in the side frame and support.

17. The electronic device of claim 16, wherein the second area comprises an area formed in the side frame and support having a second roughness value different from the first roughness value.

18. The electronic device of claim 17, wherein the second area is processed together with at least a portion of the side frame.

19. The electronic device of claim 15, wherein the first area has a closed loop shape along an inner side edge of the side frame.

20. The electronic device of claim 15, further comprising a display disposed to at least partially be visible in an internal space of the electronic device from the outside through the front cover, and a second adhesive member disposed between the display and the support.

* * * * *